United States Patent
Futagawa et al.

(10) Patent No.: US 10,141,721 B2
(45) Date of Patent: Nov. 27, 2018

(54) LIGHT-EMITTING ELEMENT AND MANUFACTURING METHOD THEREOF

(71) Applicant: SONY CORPORATION, Tokyo (JP)

(72) Inventors: Noriyuki Futagawa, Kanagawa (JP);
Tatsushi Hamaguchi, Kanagawa (JP);
Shoichiro Izumi, Kanagawa (JP);
Masaru Kuramoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/314,989

(22) PCT Filed: Apr. 16, 2015

(86) PCT No.: PCT/JP2015/061698
§ 371 (c)(1),
(2) Date: Nov. 30, 2016

(87) PCT Pub. No.: WO2015/194243
PCT Pub. Date: Dec. 23, 2015

(65) Prior Publication Data
US 2017/0201073 A1 Jul. 13, 2017

(30) Foreign Application Priority Data
Jun. 17, 2014 (JP) .............................. 2014-124602

(51) Int. Cl.
*H01S 5/00* (2006.01)
*H01S 5/343* (2006.01)
(Continued)

(52) U.S. Cl.
CPC ...... *H01S 5/34333* (2013.01); *H01S 5/18361* (2013.01); *H01L 21/02293* (2013.01); *H01L 21/0334* (2013.01); *H01L 21/28* (2013.01)

(58) Field of Classification Search
CPC .......................... H01S 5/3433; H01S 5/18361
(Continued)

(56) References Cited

U.S. PATENT DOCUMENTS

| 6,233,267 B1 * | 5/2001 | Nurmikko .............. B82Y 20/00 372/46.014 |
| 2008/0283851 A1 * | 11/2008 | Akita ..................... C30B 25/18 257/94 |
| 2011/0057165 A1 * | 3/2011 | Pinnington ....... H01L 21/76254 257/13 |

FOREIGN PATENT DOCUMENTS

| JP | 10-308558 A | 11/1998 |
| JP | 2000-022282 A | 1/2000 |

(Continued)

*Primary Examiner* — Vu A Vu
(74) *Attorney, Agent, or Firm* — Chip Law Group

(57) ABSTRACT

A light-emitting element includes at least a GaN substrate 11; a first light reflecting layer 41 formed on the GaN substrate 11 and functioning as a selective growth mask layer 44; a first compound semiconductor layer 21, an active layer 23, and a second compound semiconductor layer 22 that are formed on the first light reflecting layer; and a second electrode 32 and a second light reflecting layer 42 that are formed on the second compound semiconductor layer 22. An off angle of the plane orientation of the surface of the GaN substrate 11 is 0.4 degrees or less, the area of the first light reflecting layer 41 is $0.8S_0$ or less, where $S_0$ represents the area of the GaN substrate 11, and as a bottom layer 41A of the first light reflecting layer, a thermal expansion relaxation film 44 is formed on the GaN substrate 11.

12 Claims, 9 Drawing Sheets

(51) Int. Cl.
*H01S 5/183* (2006.01)
*H01L 21/02* (2006.01)
*H01L 21/033* (2006.01)
*H01L 21/28* (2006.01)

(58) Field of Classification Search
USPC ........................................ 372/44.01
See application file for complete search history.

(56) References Cited

FOREIGN PATENT DOCUMENTS

| | | |
|---|---|---|
| JP | 2000-228563 A | 8/2000 |
| JP | 2001-148544 A | 5/2001 |
| JP | 2001-313440 A | 11/2001 |
| JP | 2005-159047 | 6/2005 |
| JP | 2006-013547 A | 1/2006 |
| JP | 2008-306126 A | 12/2008 |

* cited by examiner

LIGHT-EMITTING ELEMENT AND MANUFACTURING METHOD THEREOF

CROSS REFERENCE TO RELATED APPLICATIONS

This application is a U.S. National Phase of International Patent Application No. PCT/JP2015/061698 filed on Apr. 16, 2015, which claims priority benefit of Japanese Patent Application No. JP 2014-124602 filed in the Japan Patent Office on Jun. 17, 2014. Each of the above-referenced applications is hereby incorporated herein by reference in its entirety.

TECHNICAL FIELD

The present disclosure relates to a light-emitting element (specifically, a surface emitting laser element also called a vertical resonator laser, VCSEL), and a manufacturing method thereof.

BACKGROUND ART

In a surface emitting laser element, laser oscillation is generally caused by oscillating light between two light reflection layers (distributed Bragg reflector layers, DBR layers). Accordingly, it is necessary to smooth a semiconductor surface for forming a DBR layer in sub-nanometer order. When an appropriate smoothness cannot be obtained, optical reflectance of each DBR layer is lowered, and variations in the characteristics (oscillation threshold and the like) are increased, which eventually makes it difficult to even obtain laser oscillation.

A method of manufacturing a nitride surface emitting laser using a selective growth method is known from Japanese Patent Application Laid-Open No. 10-308558. That is, a method of manufacturing a nitride semiconductor laser element disclosed in the laid-open patent application includes a step of selectively forming a multilayer film made of dielectric on a substrate surface, a step of growing a nitride semiconductor layer on top of the multilayer film, a step of growing a nitride semiconductor layer including an active layer on top of the nitride semiconductor layer formed on top of the multilayer film, and a step of using the multilayer film as at least one reflecting mirror for light emission of the active layer.

CITATION LIST

Patent Document

Patent Document 1: Japanese Patent application Laid-Open No. 10-308558

SUMMARY OF THE INVENTION

Problems to be Solved by the Invention

Meanwhile, in the method of manufacturing a nitride semiconductor laser element disclosed in the laid-open patent application described above, a substrate different from a nitride semiconductor is used. However, in the case of using such a substrate, specifically, when a sapphire substrate is used, for example, a large number of dislocations occur due to lattice mismatch between a GaN-based compound semiconductor layer and a sapphire substrate, which gives significant adverse effects on the reliability of the light-emitting element. Further, as a sapphire substrate has lower heat conductivity than that of a typical semiconductor substrate, the heat resistance of the light-emitting element becomes extremely large, which causes an increase in the oscillation threshold electric current, a drop in the optical output, deterioration of the element service life, and the like. In addition, as a sapphire substrate does not have electrical conductivity, an n-side electrode cannot be provided to the rear face of the substrate, and an n-side electrode must be provided to the same side as that of a p-side electrode. As such, the element area increases, so that there is a problem that the productivity is poor. Further, the laid-open patent application described above fails to describe problems of peeling off of a multilayer film (selective growth mask layer) from a substrate due to a difference between a linear thermal expansion coefficient of the substrate and a linear thermal expansion coefficient of the multilayer film (selective growth mask layer), and variations in the characteristics (for example, variations in the optical reflectance) due to roughness of a surface of a nitride semiconductor layer when the nitride semiconductor layer including an active layer is grown, for example.

Accordingly, an object of the present disclosure is to provide a light-emitting element in which variations in the characteristics are less likely to be caused, which has high reliability, and which is capable of preventing occurrence of a problem of peeling off of a selective growth mask layer from a substrate due to a difference between a linear thermal expansion coefficient of the substrate and a linear thermal expansion coefficient of a selective growth mask layer, and to provide a method of manufacturing the same.

Solutions to Problems

A light-emitting element manufacturing method according a first aspect or a second aspect of the present disclosure for achieving the object described above is a light-emitting element manufacturing method including at least the steps of after forming a selective growth mask layer on a GaN substrate;

selectively growing a first compound semiconductor layer from a surface of the GaN substrate not covered with the selective growth mask layer, and covering the GaN substrate and the selective growth mask layer with the first compound semiconductor layer; and then sequentially forming an active layer, a second compound semiconductor layer, a second electrode, and a second light reflecting layer, on the first compound semiconductor layer, wherein the selective growth mask layer functions as a first light reflecting layer, an off angle of plane orientation of the surface of the GaN substrate is 0.4 degrees or less, an area of the selective growth mask layer is 0.8 $S_0$ or less, where $S_0$ represents an area of the GaN substrate. It should be noted that the selective growth mask layer may be covered entirely with the first compound semiconductor layer, or the selective growth mask layer may be covered partially. Further, the top face of the first compound semiconductor layer covering the selective growth mask layer may be flat, or may have a dent in a portion.

Then, in the light-emitting element manufacturing method according to the first aspect of the present disclosure, as a bottom layer of the selective growth mask layer, a thermal expansion relaxation film is formed on the GaN substrate.

Further, in the light-emitting element manufacturing method according to the second aspect of the present disclosure, a linear thermal expansion coefficient (CTE) of the bottom layer of the selective growth mask layer in contact with the GaN substrate satisfies $1\times10^{-6}/K \leq CTE \leq 1\times10^{-5}/K$, preferably $1\times10^{-6}/K < CTE \leq 1\times10^{-5}/K$.

A light-emitting element according to the first aspect or the second aspect of the present disclosure for achieving the object described above is a light-emitting element including at least a GaN substrate;

a first light reflecting layer formed on the GaN substrate and functioning as a selective growth mask layer;

a layered structure formed on the first light reflecting layer, the layered structure being configured of a first compound semiconductor layer, an active layer and a second compound semiconductor layer; and a second electrode and a second light reflecting layer formed on the second compound semiconductor layer, wherein an off angle of plane orientation of the surface of the GaN substrate is 0.4 degrees or less, an area of the first light reflecting layer is 0.8 $S_0$ or less, where $S_0$ represents an area of the GaN substrate.

Then, in the light-emitting element according to the first aspect of the present disclosure, as a bottom layer of the first light reflecting layer, a thermal expansion relaxation film is formed on the GaN substrate. Further, in the light-emitting element according to the second aspect of the present disclosure, a linear thermal expansion coefficient (CTE) of the bottom layer of first light reflecting layer in contact with the GaN substrate satisfies $1\times10^{-6}/K \leq CTE \leq 1\times10^{-3}/K$, preferably $1\times10^{-6}/K < CTE \leq 1\times10^{-3}/K$.

Effects of the Invention

In the light-emitting element and the manufacturing method thereof according to the first aspect and the second aspect of the present disclosure, as an off angle of the plane orientation of the surface of the GaN substrate and the area ratio of the selective growth mask layer (first light reflecting layer) are defined, it is possible to reduce the surface roughness of the second compound semiconductor layer. This means that it is possible to form a second compound semiconductor layer having excellent surface morphology. As such, it is possible to obtain a second light reflecting layer having excellent smoothness, that is, desired optical reflectance can be obtained, and variations in the characteristics of the light-emitting element are less likely to be caused. In addition, as a thermal expansion relaxation film is formed or a value of CTE is defined, it is possible to prevent occurrence of a problem that the selective growth mask layer is peeled off from the GaN substrate due to a difference between the linear thermal expansion coefficient of the GaN substrate and the linear thermal expansion coefficient of the selective growth mask layer, whereby a light-emitting element having high reliability can be provided. Further, as a GaN substrate is used, dislocation is less likely to be caused in the compound semiconductor layer, and it is possible to prevent a problem that heat resistance of the light-emitting element increases. As such, it is possible to give high reliability to the light-emitting element, and to provide an n-side electrode on a side different from the side of a p-side electrode with reference to the GaN substrate. It should be noted that the effects described in the present description are provided exemplarily without any limitation, and additional effects are also acceptable.

MODE FOR CARRYING OUT THE INVENTION

Figure 1A:
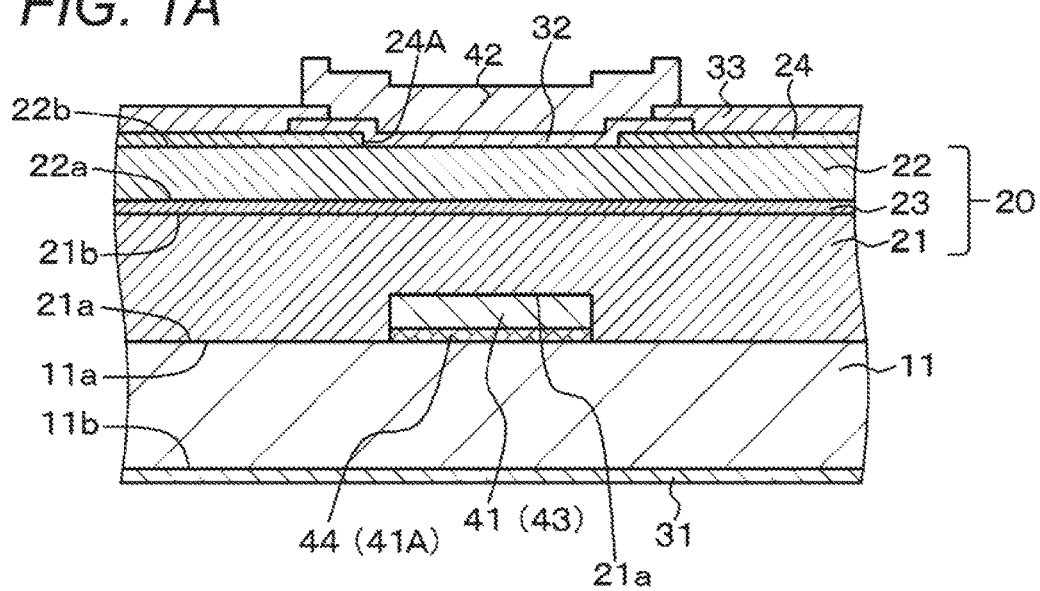
FIG. 1A and FIG. 1B are schematic partial sectional views of a light-emitting element and an exemplary modification of a first embodiment.

Hereinafter, while the present disclosure is described on the basis of embodiments with reference to the drawings, the present disclosure is not limited to the embodiments. Various numerical values and materials described in the embodiments are exemplarily shown. It should be noted that the description will be given in the following order:

1. Overall description of light-emitting elements according to a first aspect and a second aspect of the present disclosure, and light-emitting element manufacturing methods according to the first aspect and the second aspect of the present disclosure 2. First embodiment (the light-emitting elements according to the first aspect and the second aspect of the present disclosure, and the light-emitting element manufacturing methods according to the first aspect and the second aspect of the present disclosure)

3. Second embodiment (a modification of the first embodiment)

4. Third embodiment (another modification of the first embodiment), and the like

[Overall Description of Light-Emitting Elements According to a First Aspect and a Second Aspect of the Present Disclosure, and Light-Emitting Element Manufacturing Methods According to the First Aspect and the Second Aspect of the Present Disclosure]

A light-emitting element according to a first aspect of the present disclosure or a light emitting element obtained by a light-emitting element manufacturing method according to the first aspect of the present disclosure may collectively be referred to as "a light-emitting element and the like according to the first aspect of the present disclosure". Further, a light-emitting element according to a second aspect of the present disclosure or a light emitting element obtained by a light-emitting element manufacturing method according to the second aspect of the present disclosure may collectively be referred to as "alight-emitting element and the like according to the second aspect of the present disclosure". A face of a first compound semiconductor layer opposing an active layer may be called a second face of the first compound semiconductor layer, and a face of the first compound semiconductor layer opposing the second face of the first compound semiconductor layer may be called a first face of the first compound semiconductor layer. A face of a second compound semiconductor layer opposing the active layer may be called a first face of the second compound semiconductor layer, and a face of the second compound semiconductor layer opposing the first face of the second compound semiconductor layer may be called a second face of the second compound semiconductor layer.

An off angle in the plane orientation of a surface of a GaN substrate indicates an angle defined by the plane orientation of a crystal plane of the surface of the GaN substrate and a normal line of the surface of the GaN substrate when viewed macroscopically. Further, in the light-emitting element manufacturing methods according to the first aspect and the second aspect of the present disclosure, assuming that the area of the GaN substrate is $S_0$, it is defined that the area of a selective growth mask layer is $0.8S_0$ or less, and in the light-emitting elements according to the first aspect and the second aspect of the present disclosure, assuming that the area of the GaN substrate is $S_0$, it is defined that the area of a first light reflecting layer is $0.8S_0$ or less. However, "the area $S_0$ of the GaN substrate" indicates the area of the GaN substrate remained when a light-emitting element is finally obtained. A bottom layer of the selective growth mask layer or a bottom layer of the first light reflecting layer does not have a function as a light reflecting layer.

In the light-emitting element and the like according to the first aspect of the present disclosure, a thermal expansion relaxation film may be in a mode made of at least one type of material selected from the group consisting of silicon nitride ($SiN_X$), aluminum oxide ($AlO_X$), niobium oxide ($NbO_X$), tantalum oxide ($TaO_X$), titanium oxide ($TiO_X$), magnesium oxide ($MgO_X$), zirconium oxide ($ZrO_X$), and aluminum nitride ($AlN_X$). It should be noted that a value of a suffix "X" attached to the chemical formula for each of the substances, or a suffix "Y" or a suffix "Z", described below, includes not only a value based on the stoichiometry of each material but also a value deviated from a value based on the stoichiometry. This is similar in the below description. Then, in the light-emitting element and the like according to the first aspect of the present disclosure including such a preferable mode, it is desirable to satisfy $t_1=\lambda_0/(4n_1)$, preferably $t_1=\lambda_0/(2n_1)$, where $t_1$ represents a thickness of the thermal expansion relaxation film, $\lambda_0$ represents an emission wavelength of the light-emitting element, and $n_1$ represents a refractive index of the thermal expansion relaxation film. However, the thickness $t_1$ of the expansion relaxation film is arbitrary, essentially, which may be $1\times10^{-7}$ m or less, for example.

In the light-emitting element and the like according to the second aspect of the present disclosure, a bottom layer of the selective growth mask layer (first light reflecting layer) may be in a mode made of at least one type of material selected from the group consisting of silicon nitride ($SiN_X$), aluminum oxide ($AlO_X$), niobium oxide ($NbO_X$), tantalum oxide ($TaO_X$), titanium oxide ($TiO_X$), magnesium oxide ($MgO_X$), zirconium oxide ($ZrO_X$), and aluminum nitride ($AlN_X$). Then, in the light-emitting element and the like according to the second aspect of the present disclosure including such a preferable mode, it is desirable to satisfy $t_1=\lambda_0/(4n_1)$ preferably $t_1=\lambda_0/(2n_1)$, where $t_1$ represents a thickness of the bottom layer of the selective growth mask layer (first light reflecting layer), $\lambda_0$ represents an emission wavelength of the light-emitting element, and $n_1$ represents a refractive index of the bottom layer of the selective growth mask layer (first light reflecting layer). However, the thickness $t_1$ of the bottom layer of the selective growth mask layer (first light reflecting layer) is arbitrary, essentially, which may be $1\times10^{-7}$ m or less, for example.

In the light-emitting element manufacturing methods according to the first aspect and the second aspect of the present disclosure including various preferable modes described above, the GaN substrate may remain, or the GaN substrate may be removed after forming, the active layer, the second compound semiconductor layer, a second electrode, and a second light reflecting layer, sequentially on the first compound semiconductor layer, with the first light reflecting layer being used as a stopper layer. Specifically, the active layer, the second compound semiconductor layer, the second electrode, and the second light reflecting layer are formed sequentially on the first compound semiconductor layer, and after the second light reflecting layer is fixed to the supporting substrate, the GaN substrate is removed with the first light reflecting layer being used as the stopper layer, whereby the first compound semiconductor layer (first face of the first compound semiconductor layer) and the first light reflecting layer may be exposed. Further, a first electrode may be formed on the first compound semiconductor layer (first face of the first compound semiconductor layer).

Removal of the GaN substrate may be in a mode in which it is performed on the basis of a chemical/mechanical polishing method (CMP method). It should be noted that first, a part of the GaN substrate may be removed, or the thickness of the GaN substrate may be reduced, by means of a wet etching method using alkali aqueous solution such as aqueous sodium hydroxide solution or aqueous potassium hydroxide solution, ammonia solution+hydrogen peroxide solution, sulphuric acid solution+hydrogen peroxide solution, hydrochloric acid solution+hydrogen peroxide solution, phosphoric acid solution+hydrogen peroxide solution, or the like, a dry etching method, a lift-off method using laser, a mechanical polishing method or the like, or a combination thereof, and then, the first compound semiconductor layer (first face of the first compound semiconductor layer) and the first light reflecting layer may be exposed by performing a chemical/mechanical polishing method.

Furthermore, in the light-emitting element and the like according to the first aspect and the second aspect of the present disclosure including various preferable modes described above, the surface roughness Ra of the second compound semiconductor layer (second face of the second compound semiconductor layer) is preferably 1.0 nm or less. The surface roughness Ra is defined in JIS B-610:2001, and specifically, it can be measured on the basis of observation based on AFM or sectional TEM.

Further, in the light-emitting element and the like according to the first aspect and the second aspect of the present disclosure including various preferable modes described above, a planar shape of the selective growth mask layer (or the first light reflecting layer) may be in a mode of any of various polygonal shapes including a regular hexagonal shape, a circular shape, an oval shape, a lattice shape (rectangle), an island-like shape, or a stripe shape. While a sectional shape of the selective growth mask layer (or the first light reflecting layer) may be a rectangular shape, it is more preferable that it is a trapezoidal shape, that is, aside face of the selective growth mask layer (or the first light reflecting layer) is in a forward tapered shape. As a method of forming the selective growth mask, a combination of physical vapor deposition method (PVD method) such as sputtering, chemical vapor deposition method (CVD), or a paint-on method, and a lithography technique or an etching technique, may be given.

It is preferable to satisfy $$t_2 = \lambda_0/(4n_2)$$

where $t_2$ represents a thickness of a top layer (layer in contact with the first compound semiconductor layer) of the first light reflecting layer, and $n_2$ represents a refractive index of a top layer of the first light reflecting layer, and further, by satisfying $$t_2 = \lambda_0/(2n_2),$$

the top layer of the first light reflecting layer becomes an absent layer with respect to the light having a wavelength of $\lambda_0$. The top layer (the layer in contact with the first compound semiconductor layer) of the first light reflecting layer may be in a mode of being configured of a silicon nitride film.

In the light-emitting element and the like according to the first aspect or the second aspect of the present disclosure including various preferable modes described above, a distance from the first light reflecting layer to the second light reflecting layer is preferably 0.15 μm or more but 50 μm or less.

Further, in the light-emitting element and the like according to the first aspect or the second aspect of the present disclosure including various preferable modes described above, a mode, in which an area centroid point of the second light reflecting layer is not present on a normal line with respect to the first light reflecting layer passing through the area centroid point of the first light reflecting layer, is acceptable.

Furthermore, in the light-emitting element and the like according to the first aspect or the second aspect of the present disclosure including various preferable modes described above, a mode, in which an area centroid point of the active layer is not present on a normal line with respect to the first light reflecting layer passing through the area centroid point of the first light reflecting layer, is acceptable.

When the first compound semiconductor layer is formed, on the GaN substrate where the selective growth mask layer is formed, by lateral overgrowth with use of a method allowing epitaxial growth in a lateral direction such as an epitaxial lateral overgrowth (ELO) method, when the first compound semiconductor layer growing epitaxially toward the center portion of the selective growth mask layer from an edge portion of the selective growth mask layer associates, there is a case where a large amount of crystal defect occurs at the associated portion. When the associated portion where a large amount of crystal defect exists is located at a center portion of an element region (to be described below), the characteristic of the light-emitting element may be adversely affected. As described above, with the mode in which the area centroid point of the second light reflecting layer is not present on the normal line with respect to the first light reflecting layer passing through the first light reflecting layer, and the mode in which the area centroid point of the active layer is not present on the normal line with respect to the first light reflecting layer passing through the area centroid point of the first light reflecting layer, occurrence of an adverse effect on the characteristic of the light-emitting element can be prevented reliably.

In the light-emitting element and the like according to the first aspect or the second aspect of the present disclosure including various preferable modes described above, light generated in the active layer may be in a mode in which the light is emitted to the outside via the second light reflecting layer (hereinafter referred to as a "light-emitting element of second light reflecting layer emission type" for convenience) or may be in a mode in which the light is emitted to the outside via the first light reflecting layer (hereinafter referred to as a "light-emitting element of first light reflecting layer emission type" for convenience). It should be noted that in the case of the light-emitting element of first light reflecting layer emission type, the GaN substrate may be removed as described above in some instances.

Then, in the case of a light-emitting element of the first light reflecting layer emission type, it is desirable to satisfy $$S_1 > S_2,$$

and in the case of a light-emitting element of the second light reflecting layer emission type, it is desirable to satisfy $$S_1 < S_2,$$

where $S_1$ represents an area of a portion of the first light reflecting layer in contact with the first face of the first compound semiconductor layer (a portion of the first light reflecting layer opposing the second light reflecting layer), and $S_2$ represents an area of a portion of the second light reflecting layer opposing the second face of the second compound semiconductor layer (a portion of the second light reflecting layer opposing the first light reflecting layer), although the present disclosure is not limited to this.

Further, in the mode in which the area centroid point of the second light reflecting layer is not present on the normal line with respect to the first light reflecting layer passing through the area centroid point of the first light reflecting layer, and in the mode in which the area centroid point of the active layer is not present on the normal line with respect to the first light reflecting layer passing through the area centroid point of the first light reflecting layer, in the case of a light-emitting element of the first light reflecting layer emission type, it is desirable to satisfy $$S_3 > S_4,$$

and in the case of a light-emitting element of the second light reflecting layer emission type, it is desirable to satisfy $$S_3 < S_4,$$

where $S_3$ represents an area of a portion of the first light reflecting layer in contact with the first face of the first compound semiconductor layer (a portion of the first light reflecting layer opposing the second light reflecting layer) which constitutes an element region (described below), and $S_4$ represents an area of a portion of the second light reflecting layer opposing the second face of the second compound semiconductor layer (a portion of the second light reflecting layer opposing the first light reflecting layer) which constitutes the element region, although the present disclosure is not limited to this.

In the light-emitting element of the first light reflecting layer emission type, in the case of removing the GaN substrate, the second light reflecting layer may be in a mode of being fixed to the supporting substrate. In the light-emitting element of the first light reflecting layer emission type, in the case of removing the GaN substrate, as an arrangement state of the first light reflecting layer and the first electrode on the first face of the first compound semiconductor layer, a state where the first light reflecting layer and the first electrode are in contact with each other may be given, or a state where the first light reflecting layer and the first electrode are separated from each other may be given, and in some instances, a state where the first electrode is formed on to the edge portion of the first light reflecting layer, or a state where the first light reflecting layer is formed on to the edge portion of the first electrode may be given. Here, in the case of a state where the first light reflecting layer is formed on to the edge portion of the first electrode, the first electrode needs to have an opening of a certain size so as not to absorb basic mode light of laser oscillation as much as possible. As the size of the opening varies according to a wavelength of the basic mode or a light confinement structure in the lateral direction (in-plane direction of the first compound semiconductor layer), it is preferable to be in about several times order of the emission wavelength $\lambda_0$, although it is not limited to this. Alternatively, it is possible to have a configuration in which the first light reflecting layer and the first electrode are separated from each other, that is, having an offset, and the separated distance is 1 mm or less.

Further, in the light-emitting element and the like according to the first aspect or the second aspect of the present disclosure including various preferable modes described above, the first electrode may be in a mode of being made of metal or an alloy, and the second electrode may be in a mode of being made of a transparent conductive material. By making the second electrode from a transparent conductive material, an electric current can be expanded in the lateral direction (in-plane direction of the second compound semiconductor layer), and to supply the electric current to an element region (described subsequently) with high efficiency.

An "element region" indicates a region where a constricted electric current is injected, or a region where light is confined by a refractive index difference or the like, or a region where laser oscillation is caused within a region sandwiched between the first light reflecting layer and the second light reflecting layer, or a region actually contributing to laser oscillation within a region sandwiched between the first light reflecting layer and the second light reflecting layer.

As described above, the light-emitting element may be configured to be formed of a surface emitting laser element (vertical resonator laser, VCSEL) which emits light from the top face of the first compound semiconductor layer via the first light reflecting layer, or may be configured to be formed of a surface emitting laser element which emits light from the top face of the second compound semiconductor layer via the second light reflecting layer.

In the light-emitting element and the like according to the first aspect and the second aspect of the present disclosure including various preferable modes described above, a layered structure formed of the first compound semiconductor layer, the active layer, and the second compound semiconductor layer may be configured of a GaN-based compound semiconductor, specifically. Here, as a GaN-based compound semiconductor, more specifically, GaN, AlGaN, InGaN, or AlInGaN can be given. Further, such a compound semiconductor may contain a boron (B) atom, a thallium (Tl) atom, an arsenic (As) atom, a phosphorus (P) atom, or an antimony (Sb) atom, as desired. It is desirable that the active layer has a quantum well structure. Specifically, it may have a single quantum well structure (QW structure) or a multiple quantum well structure (MQW structure). While an active layer having a quantum well structure has a structure in which at least one layer of a well layer and at least one layer of a barrier layer are layered, as a combination of (a compound semiconductor constituting the wall layer, and a compound semiconductor constituting a barrier layer), $(In_yGa_{(1-y)}N, GaN)$, $(In_yGa_{(1-y)}N, In_zGa_{(1-z)}N)$ [provided that y>z], or $(In_yGa_{(1-y)}N, AlGaN)$ may be exemplarily shown. The first compound semiconductor layer can be configured of a compound semiconductor of a first conductive-type (n-type, for example), and the second compound semiconductor layer can be configured of a compound semiconductor of a second conductive-type (p-type, for example) which is different from the first conductive type. The first compound semiconductor layer and the second compound semiconductor layer are also called a first cladding layer and a second cladding layer. It is desirable that a current constriction structure is formed between the second electrode and the second compound semiconductor layer. The first compound semiconductor layer and the second compound semiconductor layer each may be a layer of a single structure, a layer of a multiple structure, or a layer of a super lattice structure. Further, it may be a layer having a composition gradient layer or a concentration gradient layer.

In order to obtain a current constriction structure, a current constriction layer made of an insulating material ($SiO_X$, $SiN_X$, or $AlO_X$, for example) may be formed between the second electrode and the second compound semiconductor layer, or a mesa structure may be formed by performing etching on the second compound semiconductor layer by the RIE method or the like, or a current constriction region may be formed by partially oxidizing a portion of the layered second compound semiconductor layer from the lateral direction, or a region where the conductivity is lowered may be formed by ion-implanting impurity into the second compound semiconductor layer, or these may be combined appropriately. However, it is necessary that the second electrode is electrically connected with a portion of the second compound semiconductor layer where an electric current flows by the current constriction.

While it has been known that the characteristic of a GaN substrate is changed to be polar/nonpolar/semipolar according to the growth face, any of the principal planes of a GaN substrate can be used for formation of a compound semiconductor layer. Further, regarding the principal planes of a GaN substrate, depending on the crystal structure (for example, cubic crystal type, hexagonal crystal type, or the like), a plane in which the plane orientation of a crystal plane referred to as a so-called A plane, B plane, C plane, R plane, M plane, N plane, S plane, or the like is made off in a particular direction (including the case where the off angle is 0 degrees) is used. Methods of forming various compound semiconductor layers for constituting a light-emitting element include an organic metal chemical vapor deposition method (MOCVD method, MOVPE method), a molecular beam epitaxy method (MBE method), a hydride vapor phase growing method in which halogen contributes to transportation or reaction, and the like may be given.

Here, as an organic gallium source in a MOCVD method, trimethylgallium (TMG) or triethylgallium (TEG) may be given, and as nitrogen source gas, ammonia gas or hydrazine may be given. In formation of a GaN-based compound semiconductor layer having n-type conductivity, silicon (Si) may be added as n-type impurity (n-type dopant), for example, and in formation of a GaN-based compound semiconductor layer having p-type conductivity, magnesium (Mg) may be added as p-type impurity (p-type dopant), for example. In the case where aluminum (Al) or indium (In) is included as a configuration atom of a GaN-based compound semiconductor layer, trimethylaluminum (TMA) may be used as an Al source, and trimethylindium (TMI) may be used as an In source. Further, as an Si source, monosilane gas ($SiH_4$ gas) may be used, and as a Mg source, bis (cyclopentadienyl) magnesium, methylcyclopentadienyl magnesium, bis (cyclopentadienyl) magnesium ($Cp_2Mg$) may be used. It should be noted that as n-type impurity (n-type dopant), Ge, Se, Sn, C, Te, S, O, Pd, or Po may be given, besides Si, and as p-type impurity (p-type dopant), Zn, Cd, Be, Ca, Ba, C, Hg, or Sr may be given, besides Mg.

The supporting substrate may be configured of any of various substrates such as a GaN substrate, a sapphire substrate, a GaAs substrate, a SiC substrate, an alumina substrate, a ZnS substrate, a ZnO substrate, a LiMgO substrate, a $LiGaO_2$ substrate, a $MgAl_2O_4$ substrate, and an InP substrate, for example. Alternatively, it may also be configured of an insulating substrate made of AlN or the like, a semiconductor substrate made of Si, SiC, Ge, or the like, a metallic substrate, or a substrate made of an alloy. However, it is preferable to use a substrate having conductivity, or it is preferable to use a metal substrate or an alloy substrate from the viewpoint of mechanical characteristic, elastic deformation, plastic deformation, heat dissipation, and the like. As a thickness of the supporting substrate, a thickness of 0.05 mm to 0.5 mm may be exemplarily given, for example. As a method of fixing the second light reflecting layer to the supporting substrate, while any known method such as a solder joining method, a normal temperature joining method, a joining method using adhesive tape, or a joining method using wax joining, can be used, it is desirable to adopt a solder joining method or a normal temperature joining method from the viewpoint of ensuring conductivity. For example, in the case of using a silicon semiconductor substrate which is a conductive substrate as a supporting substrate, it is desirable to adopt a method capable of performing joining at a low temperature of 400° C. or lower in order to suppress warpage caused by a difference in the thermal expansion coefficient. In the case of using a GaN substrate as a supporting substrate, the joining temperature may be 400° C. or higher.

The first electrode desirably has a single layer configuration or a multilayer configuration including at least one type of metal (including an alloy) selected from the group consisting of gold (Au), silver (Ag), palladium (Pd), platinum (Pt), nickel (Ni), Ti (titanium), vanadium (V), tungsten (W), chromium (Cr), aluminum (Al), copper (Cu), zinc (Zn), tin (Sn), and indium (In), for example. Specifically, Ti/Au, Ti/Al, Ti/Al/Au, Ti/Pt/Au, Ni/Au, Ni/Au/Pt, Ni/Pt, Pd/Pt, and Ag/Pd can be exemplarily shown, for example. It should be noted that a layer before "/" in a multilayer configuration is located closer to the active layer side. This is similar in the below description. The first electrode can be deposited by a PVD method such as a vacuum vapor deposition method or a sputtering method, for example.

As a transparent conductive material constituting the second electrode, indium-tin oxide (ITO, including Sn-doped $In_2O_3$, crystalline ITO, and amorphous ITO), indium-zinc oxide (IZO), IFO (F-doped $In_2O_3$), tin oxide ($SnO_2$), ATO (Sb-doped $SnO_2$), FTO (F-doped $SnO_2$), or zinc oxide (ZnO, including Al-doped ZnO and B-doped ZnO) can be given exemplarily. Alternatively, as the second electrode, a transparent conductive film in which the base layer is made of gallium oxide, titanium oxide, niobium oxide, nickel oxide, or the like can be given. However, as a material constituting the second electrode, while it depends on the arrangement state between the second light reflecting layer and the second electrode, it is not limited to a transparent conductive material. Metal such as palladium (Pd), platinum (Pt), nickel (Ni), gold (Au), cobalt (Co), or rhodium (Rh) can be used. The second electrode may be made of at least one type of these materials. The second electrode can be deposited by a PVD method such as a vacuum vapor deposition method, a sputtering method, or the like, for example.

On the first electrode and the second electrode, a pad electrode may be provided for electrical connection with an external electrode or a circuit. It is desirable that a pad electrode has a single layer configuration or a multilayer configuration including at least one type of metal selected from the group consisting of Ti (titanium), aluminum (Al), platinum (Pt), gold (Au), nickel (Ni), and palladium (Pd). Alternatively, a pad electrode may have a multilayer configuration exemplarily given as a multilayer configuration of Ti/Pt/Au, a multilayer configuration of Ti/Au, a multilayer configuration of Ti/Pd/Au, a multilayer configuration of Ti/Pd/Au, a multilayer configuration of Ti/Ni/Au, a multilayer configuration of Ti/Ni/Au/Cr/Au. In the case where the first electrode is configured of an Ag layer or an Ag/Pd layer, it is preferable to form a cover metal layer made of Ni/TiW/Pd/TiW/Ni on the surface of the first electrode, for example, and on the cover metal layer, form a pad electrode formed of a multilayer configuration of Ti/Ni/Au or a multilayer configuration of Ti/Ni/Au/Cr/Au, for example.

The light reflecting layer (Distributed Bragg Reflector layer, DBR layer) is configured of a semiconductor multilayer film or a dielectric multilayer film, for example. As a dielectric material, oxide such as Si, Mg, Al, Hf, Nb, Zr, Sc, Ta, Ga, Zn, Y, B, or Ti, nitride (for example, $SiN_X$, $AlN_X$, AlGaN, $GaN_X$, $BN_X$, or the like), fluoride, or the like may be given, for example. Specifically, $SiO_X$, $TiO_X$, $NbO_X$, $ZrO_X$, $TaO_X$, $ZnO_X$, $AlO_X$, $HfO_X$, $SiN_X$, $AlN_X$ or the like may be exemplarily given. Then, by alternately layering two types or more dielectric films made of dielectric materials having different refractive indexes among the dielectric materials, a light reflecting layer can be obtained. For example, a multilayer film such as $SiO_X/SiN_Y$, $SiO_X/NbO_Y$, $SiO_X/ZrO_Y$, $SiO_X/AlN_Y$, or the like is preferable. In order to obtain a desired optical reflectance, materials for constituting each dielectric film, film thickness, the number of layers, and the like may be selected appropriately. The thickness of each dielectric film can be adjusted appropriately depending on the material to be used or the like, which is determined by the emission wavelength $\lambda_0$ and the refractive index n at the emission wavelength $\lambda_0$ of the material to be used. Specifically, it is preferable to be odd number times of $\lambda_0/(4n)$. For example, in the light-emitting element having the emission wavelength $\lambda_0$ of 410 nm, when the light reflecting layer is configured of $SiO_X/NbO_Y$, a thickness of about 40 nm to about 70 nm can be exemplarily given. As the number of layers, two, and preferably, from about five to about twenty can be exemplarily given. As the thickness of the entire light reflecting layer, a thickness of about 0.6 μm to about 1.7 μm can be exemplarily given.

Alternatively, it is desirable that the first light reflecting layer has a dielectric film including at least a nitrogen (N) atom, and further, it is more desirable that the dielectric film including an N atom is the top layer of the dielectric multilayer film. Alternatively, it is desirable that the first light reflecting layer is covered by a dielectric material layer including at least a nitrogen (N) atom. Alternatively, it is desirable to apply nitriding treatment to the surface of the first light reflecting layer to thereby make the surface of the first light reflecting layer a layer including at least a nitrogen (N) atom (hereinafter referred to as "surface layer" for convenience). It is preferable that the thickness of a dielectric film, a dielectric material layer, or the surface layer including at least an N atom is odd number times of $\lambda_0/(4n)$. As a material constituting a dielectric film or a dielectric material layer including at least an N atom, $SiN_X$ or $SiO_XN_Z$ can be given, specifically. As described above, by forming a dielectric film, a dielectric material layer, or a surface layer including at least an N atom, when a compound semiconductor layer covering the first light reflecting layer is formed, it is possible to improve a gap between the crystal axis of the compound semiconductor layer covering the first light reflecting layer and the crystal axis of the GaN substrate, which enables the quality of the layered structure, serving as a resonator, to be enhanced.

The light reflecting layer can be formed by a well-known method. Specifically, a PVD method such as a vacuum vapor deposition method, a sputtering method, a reactive sputtering method, an ECR plasma sputtering method, a magnetron sputtering method, an ion beam assisted deposition method, an ion plating method, or a laser ablation method; any type of CVD method; a paint-on method such as a spraying method, a spin coating method, or a dip method; a method combining two types or more of these methods; a method combining any of these methods and anyone or more types of overall or partial pre-processing, irradiation with inert gas (Ar, He, Xe, or the like) or plasma, irradiation with oxygen gas, ozone gas, or plasma, oxidation treatment (thermal treatment), and exposure processing, can be given.

Further, side faces or exposed faces of the layered structure may be covered with an insulating film. An insulating film can be formed on the basis of a well-known method. It is preferable that the refractive index of a material constituting the insulating film is smaller than the refractive index of a material constituting the layered structure. As a material constituting the insulating film, a $SiO_X$-based material including $SiO_2$, a $SiN_X$-based material, a $SiO_XN_Z$-based material, $TaO_X$, $ZrO_X$, $AlN_X$, $AlO_X$, or $GaO_X$ can be exemplarily given, or an organic material such as polyimide resin can be exemplarily given. As a method of forming the insulating film, a PVD method such as a vacuum vapor deposition method or a sputtering method, or a CVD method can be given, or it can be formed by a paint-on method.

First Embodiment

A first embodiment relates to the light-emitting elements according to the first aspect and second aspect of the present disclosure, and manufacturing methods thereof.

As shown in FIG. 1A illustrating a schematic partial side face, a light-emitting element of the first embodiment or a second embodiment and a third embodiment described below is a surface emitting laser element (vertical resonator laser, VCSEL), specifically, and includes at least a GaN substrate 11, a first light reflecting layer 41 formed on the GaN substrate 11 and functioning as a selective growth mask layer 43, a layered structure 20 configured of a first compound semiconductor layer 21, an active layer 23, and a second compound semiconductor layer 22 which are formed on the first light reflecting layer 41, and a second electrode 32 and a second light reflecting layer 42 formed on the second compound semiconductor layer 22.

Then, in the light-emitting element of the first embodiment or the second embodiment and the third embodiment described below, or in the light-emitting element manufacturing method, an off angle of the plane orientation of the crystal plane of a surface 11a of the GaN substrate 11 is 0.4 degrees or less, and preferably, 0.40 degrees or less, and when the area of the GaN substrate 11 is defined as $S_0$, the area of the first light reflecting layer 41 is $0.8S_0$ or less. It should be noted that as the lower limit value of the area of the first light reflecting layer 41, $0.004 \times S_0$ can be exemplarily given, although not limited to this. Here, the plane orientation of the crystal plane of the surface 11a of the GaN substrate 11 was set to [0001]. This means that on the (0001) plane (C plane) of the GaN substrate 11, the first light reflecting layer 41 and the layered structure 20 are formed. It should be noted that as a bottom layer 41A of the first light reflecting layer 41, a thermal expansion relaxation film 44 is formed on the GaN substrate 11, and the linear thermal expansion coefficient (CTE) of the bottom layer 41A (thermal expansion relaxation film 44 corresponds thereto) of the first light reflecting layer 41, in contact with the GaN substrate 11, satisfies $1 \times 10^{-6}/K \leq CTE \leq 1 \times 10^{-3}/K$, preferably $1 \times 10^{-6}/K < CTE = 1 \times 10^{-3}/K$.

Specifically, the thermal expansion relaxation film 44 (the bottom layer of the selective growth mask layer 43) is formed of silicon nitride ($SiN_X$) satisfying $t_1 = \lambda_0/(2n_1)$, for example. It should be noted that the thermal expansion relaxation film 44 (the bottom layer of the selective growth mask layer 43) having such a film thickness is transparent with respect to light having a wavelength $\lambda_0$, and does not have a function as a light reflecting layer. Further, a planar shape of the selective growth mask layer 43 (or the first light reflecting layer 41) is a regular hexagonal shape. A regular hexagonal shape is arranged or arrayed such that compound semiconductor layers epitaxially grow laterally in a [11-20] direction or a direction crystallographically equivalent thereto. CTE values of silicon nitride ($SiN_X$) and the GaN substrate 11 are as shown in Table 1 below. The CTE values are values at 25° C.

[Table 1]
GaN substrate: $5.59 \times 10^{-6}/K$
silicon nitride ($SiN_X$): 2.6 to $3.5 \times 10^{-6}/K$ It should be noted that while the layered structure 20 is configured of the first compound semiconductor layer 21, the active layer 23, and the second compound semiconductor layer 22, more specifically, it is configured such that the first compound semiconductor layer 21 formed of a GaN-based compound semiconductor, and including a first face 21a and a second face 21b opposing the first face 21a, the active layer (light emitting layer) 23 formed of a GaN-based compound semiconductor, and brought into contact with the second face 21b of the first compound semiconductor layer 21, and the second compound semiconductor layer 22 formed of a GaN-based compound semiconductor, including a first face 22a and a second face 22b opposing the first face 22a, in which the first face 22a is brought into contact with the active layer 23, are layered. Then, on the second face 22b of the second compound semiconductor layer 22, the second light reflecting layer 42, configured of the second electrode 32 and a multilayer film, is formed, and a first electrode 31 is formed on another plane 11b of the GaN substrate 11 opposing the surface 11a of the GaN substrate 11 on which the layered structure 20 is formed. The first light reflecting layer 41, configured of a multilayer film, is formed on the surface 11a of the GaN substrate 11, and is formed in contact with the first face 21a of the first compound semiconductor layer 21.

Here, in the first embodiment, the light-emitting element is of second light reflecting layer emission type in which light is emitted from the second face 22b of the second compound semiconductor layer 22 via the second light reflecting layer 42. The GaN substrate 11 remains.

In the light-emitting element of the first embodiment or the second embodiment and the third embodiment described below, a current constriction layer 24 made of an insulating material such as $SiO_X$, $SiN_X$, or $AlO_X$ is formed between the second electrode 32 and the second compound semiconductor layer 22. The current constriction layer 24 has an opening 24A, and the second compound semiconductor layer 22 is exposed to the bottom of the opening 24A. The second electrode 32 is formed on the second face 22b of the second compound semiconductor layer 22 over the current constriction layer 24, and the second light reflecting layer 42 is formed on the second electrode 32. Further, on the edge portion of the second electrode 32, a pad electrode 33 for electrical connection with an external electrode or a circuit is connected. In the light-emitting element of the first embodiment or the second embodiment and the third embodiment described below, the planar shape of the element region is a regular hexagonal shape, and the planar shapes of the first light reflecting layer 41, the second light reflecting layer 42, and the opening 24A formed in the current constriction layer 24 are circular shapes. It should be noted that while each of the first light reflecting layer 41 and the second light reflecting layer 42 has a multilayer structure, it is shown as one layer in order to simplify the drawings. It should be noted that formation of the current constriction layer 24 is optional.

Then, in the light-emitting element of the first embodiment, a distance from the first light reflecting layer 41 to the second light reflecting layer 42 is 0.15 μm or more but 50 μm or less, and specifically, it is 10 μm, for example.

The first compound semiconductor layer 21 is configured of an n-type GaN layer having a thickness of 5 μm, and the active layer 23 having the entire thickness of 180 nm is formed of a five-tired multiple quantum well structure in which an $In_{0.04}Ga_{0.96}N$ layer (barrier layer) and an $In_{0.16}Ga_{0.84}N$ layer (well layer) are layered. The second compound semiconductor layer 22 has a double-layered configuration of a p-type AlGaN electron barrier layer (10 nm thick) and a p-type GaN layer. It should be noted that the electron barrier layer is located on the active layer side. The first electrode 31 is made of Ti/Pt/Au, and the second electrode 32 is made of a transparent conductive material, that is, ITO, and specifically, the pad electrode 33 is made of Ti/Pd/Au or Ti/Pt/Au, and the first light reflecting layer 41 and the second light reflecting layer 42 are configured of a layered structure of a $SiN_X$ layer and a $SiO_Y$ layer (the total number of layered dielectric films: 20 layers). The thickness of each layer is $\lambda_0/(4n)$.

Figure 4A:
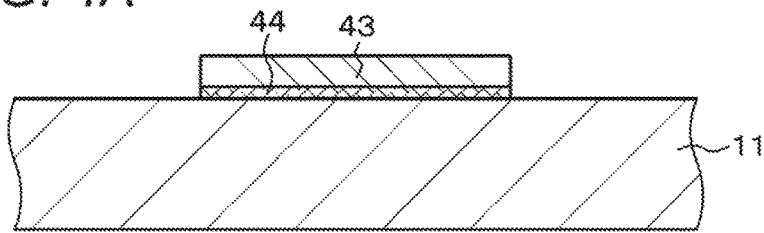
FIG. 4A, FIG. 4B, and FIG. 4C are schematic partial end views of a layered structure and the like for explaining a light-emitting element manufacturing method of the first embodiment.
Figure 4B:
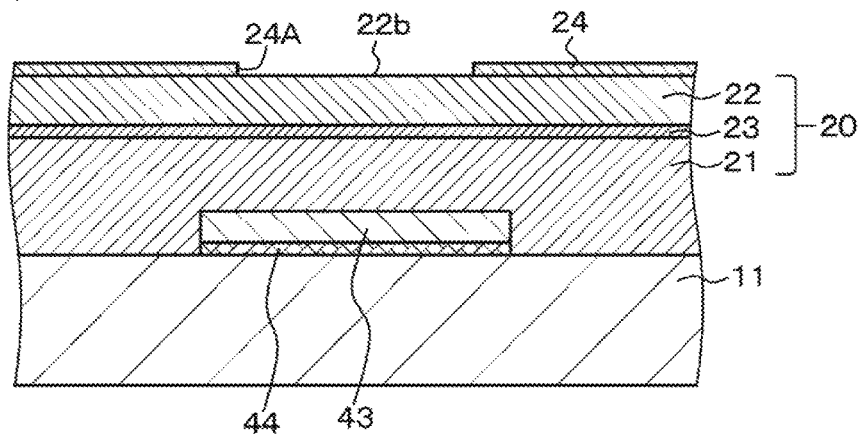
Figure 4C:
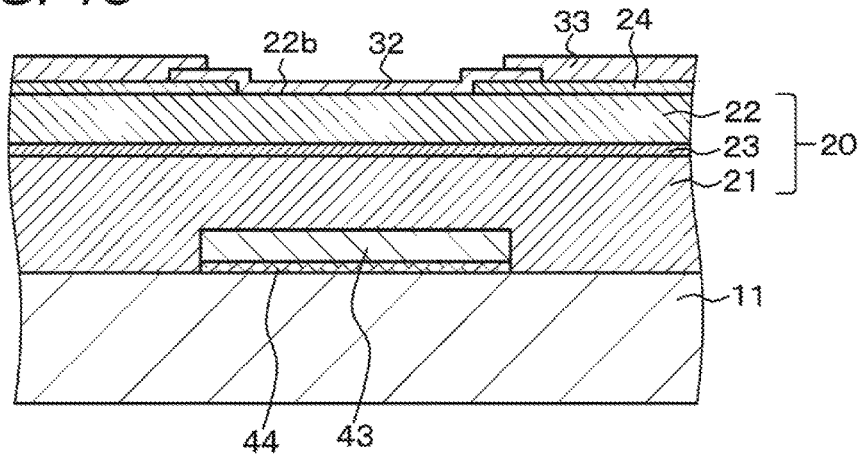

Hereinafter, a light-emitting element manufacturing method according to the first embodiment will be described with reference to FIG. 4A, FIG. 4B, and FIG. 4C each of which is a schematic partial end view of a layered structure or the like.

[Step-100]

Figure 9:
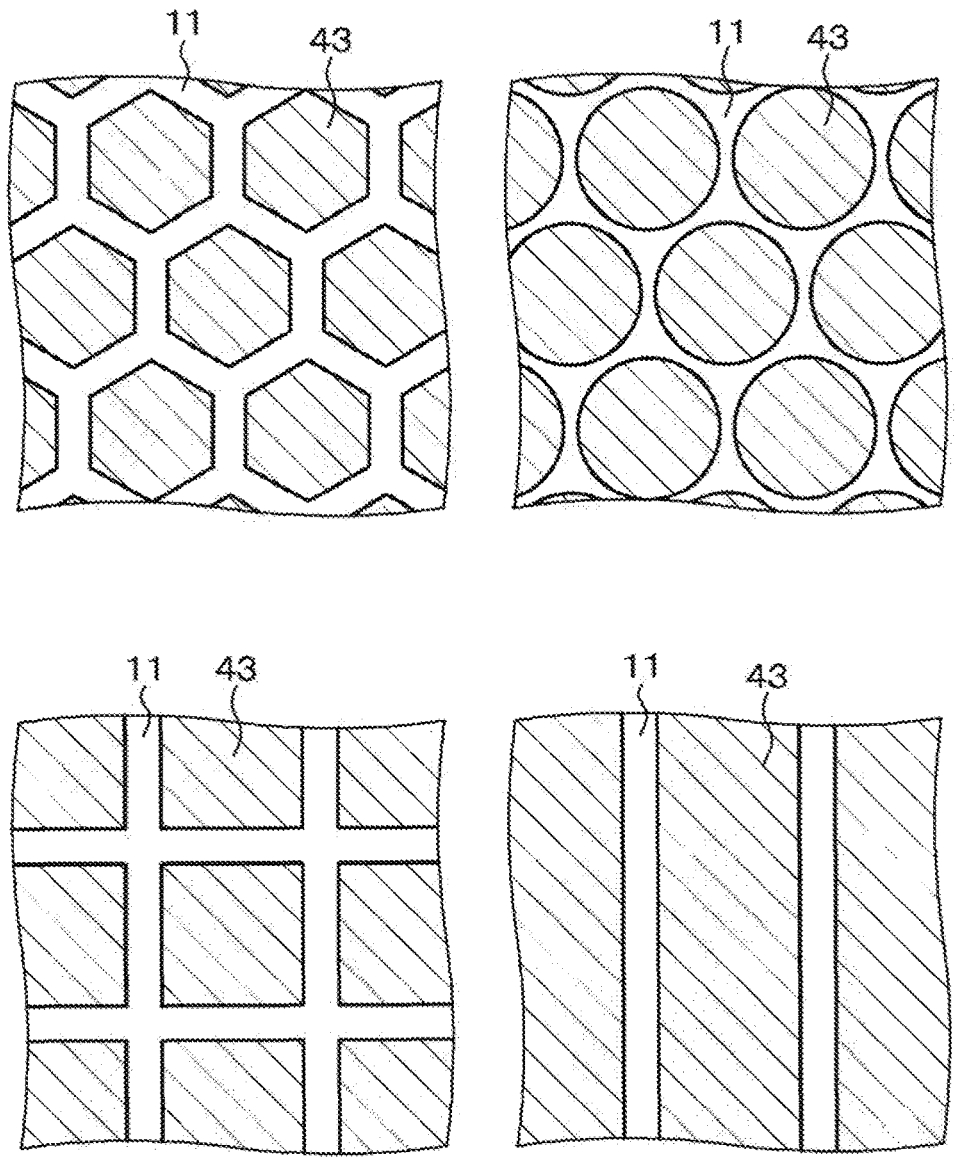
FIG. 9 shows schematic plan views of selective growth mask layers.

First, the selective growth mask layer 43 is formed on the GaN substrate 11. Specifically, on the GaN substrate 11, the thermal expansion relaxation film 44 constituting the bottom layer of the selective growth mask layer 43 is formed, and further, on the thermal expansion relaxation film 44, the remaining part (functioning as the first light reflecting layer 41) of the selective growth mask layer 43, formed of the multilayer film, is formed. Then, the selective growth mask layer 43 is patterned. In this way, the structure shown in FIG. 4A can be obtained. As shown in FIG. 9 illustrating a schematic plan view, the shape of the selective growth mask layer 43 including the thermal expansion relaxation film 44 is a regular hexagonal shape. However, the shape of the selective growth mask layer 43 is not limited to this. It may be a circular shape, a lattice shape, or a stripe shape, for example. It should be noted that in FIG. 9, the selective growth mask layer 43 is hatched to clearly show the selective growth mask layer 43. Between the selective growth mask layer 43 and the selective growth mask layer 43, the GaN substrate 11 is exposed.

[Step-110]

Next, the first compound semiconductor layer 21 is selectively grown from the surface of the GaN substrate 11 not covered with the selective growth mask layer 43, and the GaN substrate 11 and the selective growth mask layer 43 are covered with the first compound semiconductor layer 21. Specifically, the GaN substrate 11 is heated up to 1000° C. while supplying ammonia gas using a MOCVD device, and then, by using a method of allowing epitaxial growth in the lateral direction such as an ELO method based on the MOCVD method using TMG gas and $SiH_4$ gas, the first compound semiconductor layer 21 is grown in the lateral direction.

[Step-120]

Subsequently, with the temperature of the GaN substrate 11 being 800° C., the active layer 23, the second compound semiconductor layer 22, the second electrode 32, and the second light reflecting layer 42 are sequentially formed on the first compound semiconductor layer 21. Specifically, on the basis of the epitaxial growth method, after forming the active layer 23 on the first compound semiconductor layer 21 using TMG gas and TMI gas, the temperature of the GaN substrate 11 is made 950° C., and an electron barrier layer is formed using TMG gas, TMA gas, $Cp_2Mg$ gas, and a p-type GaN layer is formed using TMG gas and $Cp_2Mg$ gas, to thereby obtain the second compound semiconductor layer 22. Through the above-described step, the layered structure 20 can be obtained. This means that on the GaN substrate 11 including the selective growth mask layer 43, the layered structure 20, in which the first compound semiconductor layer 21 formed of a GaN-based compound semiconductor and including a first face 21a and a second face 21b opposing the first face 21a, the active layer 23 formed of a GaN-based compound semiconductor and brought into contact with the second face 21b of the first compound semiconductor layer 21, and the second compound semiconductor layer 22 formed of a GaN-based compound semiconductor and including a first face 22a and a second face 22b opposing the first face 22a, in which the first face 22a is brought into contact with the active layer 23, are layered, is epitaxially grown. Then, on the second face 22b of the second compound semiconductor layer 22, the current constriction layer 24, made of an insulating member of 0.2 µm thick and having the opening 24A, is formed on the basis of a well-known method. In this way, the structure shown in FIG. 4B can be obtained.

Then, on the second face 22b of the second compound semiconductor layer 22, the second electrode 32 and the second light reflecting layer 42 formed of the multilayer film are formed. Specifically, on the basis of a lift-off method, for example, the second electrode 32 made of ITO of 50 nm thick is formed on the second face 22b of the second compound semiconductor layer 22 over the current constriction layer 24, and further, the pad electrode 33 is formed on the second electrode 32 over the current constriction layer 24 by a well-known method. In this way, the structure shown in FIG. 4C can be obtained. Then, the second light reflecting layer 42 is formed on the second electrode 32 over the pad electrode 33 on the basis of a well-known method. Meanwhile, on the other surface 11b of the GaN substrate 11, the first electrode 31 is formed on the basis of a well-known method. In this way, the structure shown in FIG. 1A can be obtained.

[Step-130]

Then, the light-emitting element is separated by performing so-called element isolation, and side faces and an exposed face of the layered structure are covered with, for example, an insulating film made of $SiO_X$. Then, terminals or the like for connecting the first electrode 31 and the pad electrode 33 with an external circuit and the like are formed on the basis of a well-known method, and packaging and sealing are performed to complete the light-emitting element of the first embodiment.

In the first embodiment, a relationship between the off angle and the surface roughness Ra of the second compound semiconductor layer 22 was examined. The results are shown in Table 2 provided below. It is found from Table 2 that when the off angle exceeds 0.4 degrees, the value of the surface roughness Ra of the second compound semiconductor layer 22 increases. As such, by setting the off angle to be 0.4 degrees or less, and preferably, 0.40 degrees or less, a step bunching of the growing compound semiconductor layer can be suppressed, and it is possible to decrease the value of the surface roughness Ra of the second compound semiconductor layer 22. Consequently, the second light reflecting layer 42 having excellent smoothness can be obtained, whereby variations in the characteristics such as optical reflectance are less likely to be caused.

TABLE 2

| Off angle (degree) | Surface roughness Ra(nm) |
|---|---|
| 0.35 | 0.87 |
| 0.38 | 0.95 |
| 0.43 | 1.32 |
| 0.45 | 1.55 |
| 0.50 | 2.30 |

Further, a relationship between the area $S_0$ of the GaN substrate 11, the area of the first light reflecting layer 41, and the surface roughness Ra of the second compound semiconductor layer 22 was examined. The results are shown in Table 3 provided below. It was found from Table 3 that by setting the area of the first light reflecting layer 41 to be $0.8S_0$ or less, it was possible to decrease the value of the surface roughness Ra of the second compound semiconductor layer 22.

TABLE 3

| Area ratio of first light reflecting layer 41 | Surface roughness Ra(nm) |
|---|---|
| $0.88S_0$ | 1.12 |
| $0.83S_0$ | 1.05 |
| $0.75S_0$ | 0.97 |
| $0.69S_0$ | 0.91 |
| $0.63S_0$ | 0.85 |

From the results described above, it is found that the surface roughness Ra of the second compound semiconductor layer 22 (second face of the second compound semiconductor layer 22) is preferably 1.0 nm or less.

Further, when the bottom layer of the selective growth mask layer 43 was made of $SiO_X$ (CTE: $0.51$-$0.58 \times 10^{-6}$/K), without forming the thermal expansion relaxation film 44, and further, the light-emitting element having a configuration and a structure similar to those of the first embodiment was manufactured, the selective growth mask layer 43 was peeled off from the GaN substrate 11 during deposition of the layered structure. Meanwhile, in the first embodiment, the selective growth mask layer 43 was not peeled off from the GaN substrate 11 during deposition of the layered structure.

As described above, in the light-emitting element of the first embodiment and the manufacturing method thereof, as the off angle of the plane orientation of the crystal plane of the GaN substrate surface, and the area ratio of the selective growth mask layer (first light reflecting layer) are defined, it is possible to reduce the surface roughness of the second compound semiconductor layer. This means that it is possible to form a second compound semiconductor layer having excellent surface morphology. Consequently, as it is possible to obtain a second light reflecting layer having excellent smoothness, desired optical reflectance can be obtained, and variations in the characteristics of the light-emitting element are less likely to be caused. In addition, as the thermal expansion relaxation film is formed or the value of CTE is defined, it is possible to prevent occurrence of a problem that the selective growth mask layer is peeled off from the GaN substrate due to a difference between the linear thermal expansion coefficient of the GaN substrate and the linear thermal expansion coefficient of the selective growth mask layer, whereby a light-emitting element having high reliability can be provided. Further, as a GaN substrate is used, dislocation is less likely to be caused in the compound semiconductor layer, and it is possible to prevent a problem that the heat resistance of the light-emitting element increases. As such, it is possible to give high reliability to the light-emitting element, and to provide an n-side electrode on a side different from the side of a p-side electrode with reference to the GaN substrate.

Figure 1B:
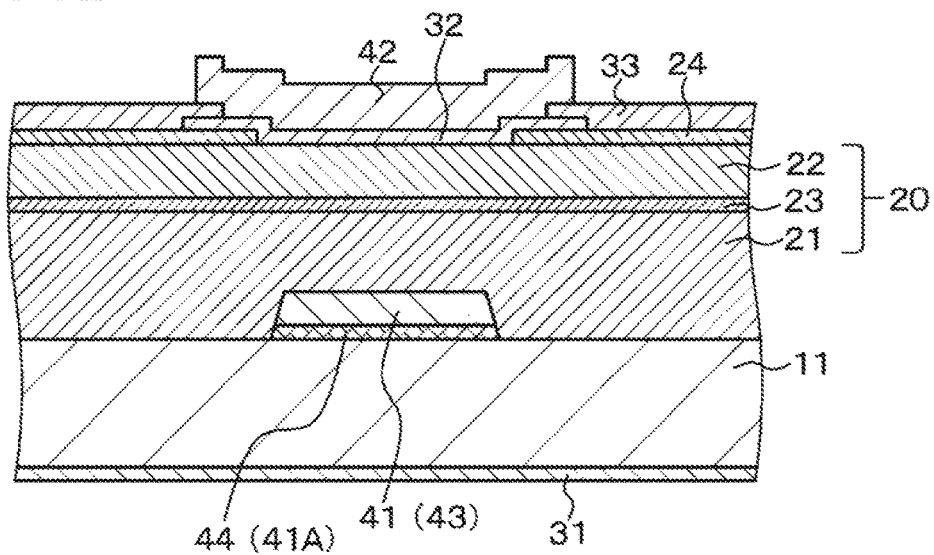
Figure 2A:
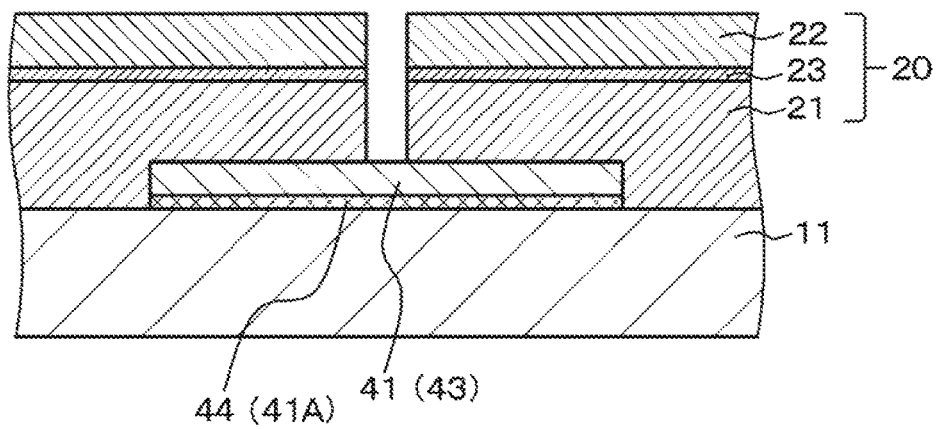
FIG. 2A and FIG. 2B are schematic partial sectional views of other exemplary modifications of the light-emitting element of the first embodiment.
Figure 2B:
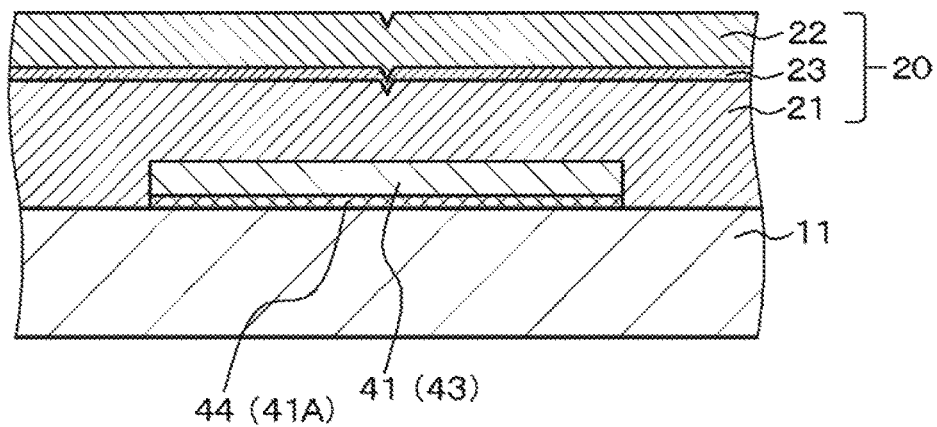
Figure 3:
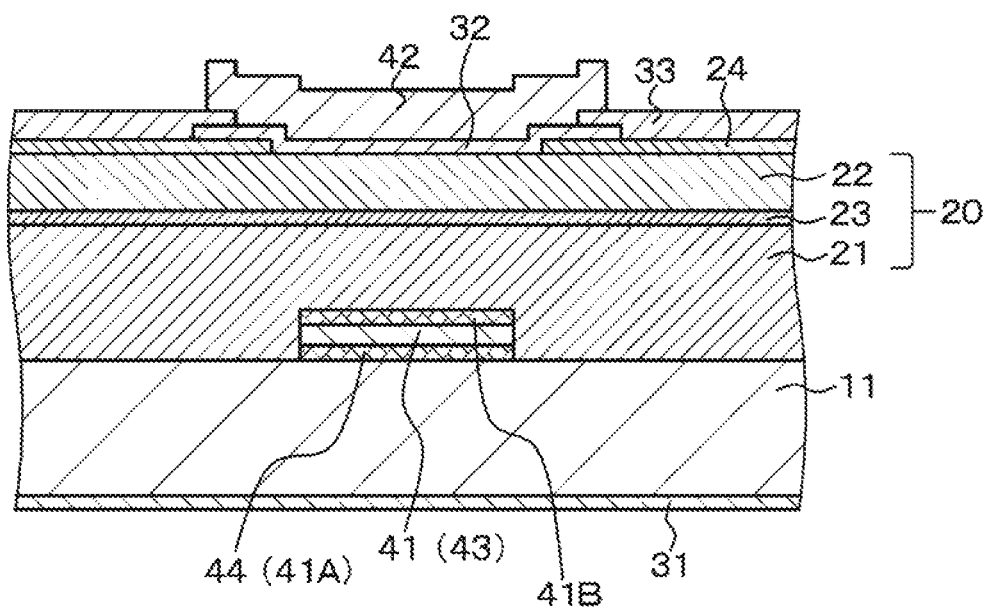
FIG. 3 is a schematic partial sectional view of still another exemplary modification of the light-emitting element of the first embodiment.

In the example shown in FIG. 1A, while the sectional shape of the selective growth mask layer 43 (or the first light reflecting layer 41) is a rectangle, it is not limited to this. It may be a trapezoid as shown in FIG. 1B. Further, in the example shown in FIG. 1A, while the selective growth mask layer 43 (or the first light reflecting layer 41) are completely covered with the first compound semiconductor layer 21, a portion of the selective growth mask layer 43 (or the first light reflecting layer 41) may be in an exposed state (see FIG. 2A), or the first compound semiconductor layer 21 on the selective growth mask layer 43 (or the first light reflecting layer 41) may be in a state where it is not completely flat (see FIG. 2B). It should be noted that in FIG. 2A and FIG. 2B, the current constriction layer 24, the second electrode 32, the pad electrode 33, the second light reflecting layer 42, and the first electrode 31 are not shown. It is only necessary that the light-emitting element is fabricated avoiding the region where the selective growth mask layer 43 (or the first light reflecting layer 41) is exposed or the region where the first compound semiconductor layer 21 is not completely flat. Specifically, it is preferable to apply the second embodiment described below. Further, as shown in FIG. 3, the top layer (the layer in contact with the first compound semiconductor layer 21) 41B of the first light reflecting layer 41 may be formed of a silicon nitride film. Then, in that case, it is preferable to satisfy $$t_2 = \lambda_0/(4n_2)$$

where $t_2$ represents a thickness of the top layer 41B of the first light reflecting layer 41, and $n_2$ represents refractive index of the top layer 41B of the first light reflecting layer 41, and further, when $$t_2 = \lambda_0/(2n_2)$$

is satisfied, the top layer 41B of the first light reflecting layer 41 becomes an absent layer with respect to the light having a wavelength $\lambda_0$.

Second Embodiment

As described above, on the GaN substrate 11 on which the selective growth mask layer 43 (or the first light reflecting layer 41) is formed, when the first compound semiconductor layer 21 is formed by lateral overgrowth with use of a method of allowing epitaxial growth in the lateral direction such as an ELO method, if the first compound semiconductor layer 21 epitaxially growing from the edge portion of the selective growth mask layer 43 toward the center portion of the selective growth mask layer 43 associates, a large number of crystal defects may be caused in the associated portion.

Figure 5:
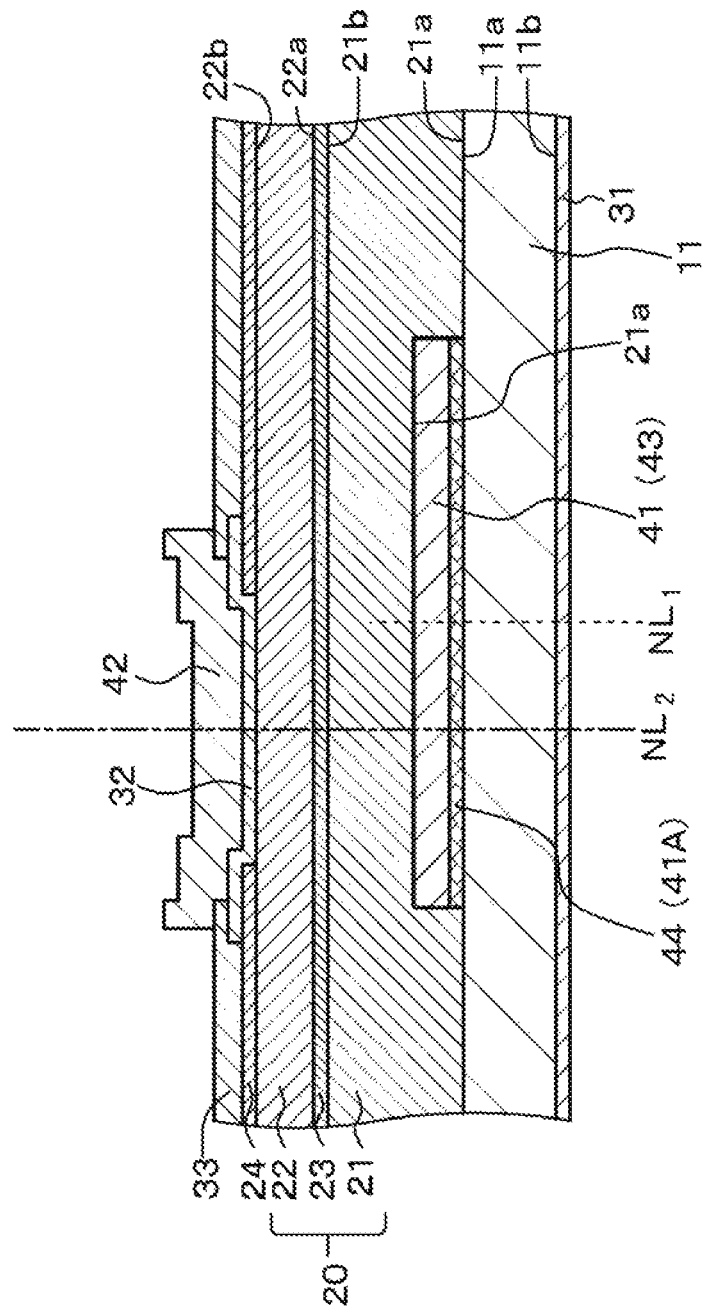
FIG. 5 is a schematic partial sectional view of a light-emitting element of a second embodiment.

In the light-emitting element of the second embodiment, and in the light-emitting element manufacturing method of the second embodiment, as shown in FIG. 5 illustrating an exemplary modification of the light-emitting element of the first embodiment shown in FIG. 1A, an area centroid point of the second light reflecting layer 42 is not present on the normal line $LN_1$ with respect to the first light reflecting layer 41 passing through the area centroid point of the first light reflecting layer 41. Alternatively, an area centroid point of the active layer 23 is not present on the normal line $LN_1$ with respect to the first light reflecting layer 41 passing through the area centroid point of the first light reflecting layer 41. The normal line with respect to the second light reflecting layer 42 passing through the area centroid point of the second light reflecting layer 42 and the normal line with respect to the active layer 23 passing through the area centroid point of the active layer 23 coincide, and this normal line is denoted as "$LN_2$". It should be noted that it is needless to say that the configuration and the structure of the light-emitting element of the second embodiment are applicable to the light-emitting element shown in FIG. 1B, FIG. 2A, FIG. 2B, and FIG. 3. As the configuration and the structure of the light-emitting element of the second embodiment, other than those described above, are similar to the configuration and the structure of the light-emitting element of the first embodiment, detailed description thereof is omitted.

In the second embodiment, an associated portion in which a large number of crystal defects are present (specifically, located on the normal line $LN_1$ or in the vicinity thereof) is not located in the center portion of the element region, the characteristics of the light-emitting element are not adversely affected, or adverse effects on the characteristics of the light-emitting element are reduced.

Third Embodiment

Figure 6A:
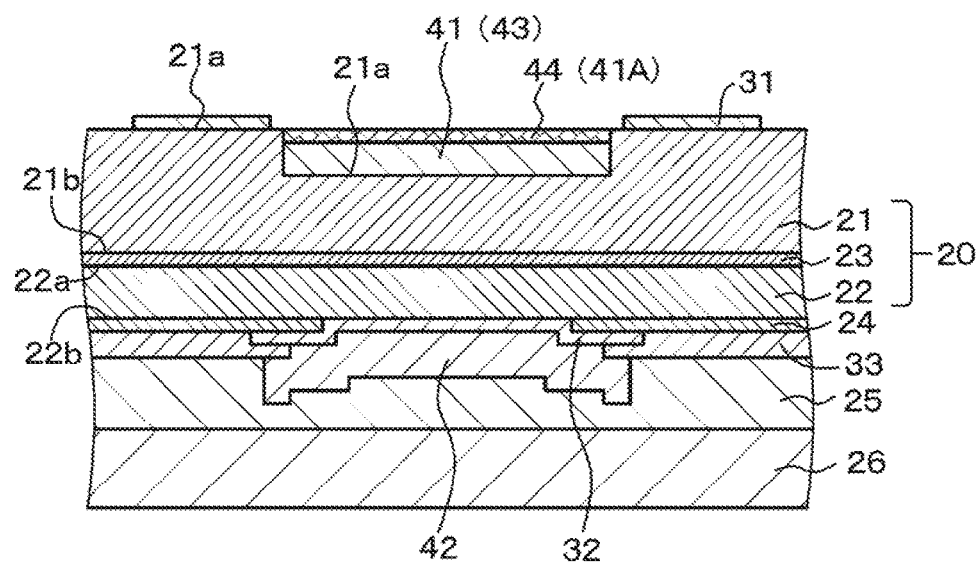
FIG. 6A and FIG. 6B are schematic partial sectional views of a light-emitting element and an exemplary modification of a third embodiment.

A third embodiment is a modification of the first embodiment and the second embodiment. As shown in FIG. 6A illustrating a schematic partial sectional view, in the light-emitting element of the third embodiment, specifically, light generated in the active layer 23 is emitted to the outside from the top face of the first compound semiconductor layer 21 via the first light reflecting layer 41. This means that the light-emitting element of the third embodiment formed of a surface emitting laser element (vertical resonator laser, VCSEL) is a light-emitting element of first light reflecting layer emission type. Then, in the light-emitting element of the third embodiment, the second light reflecting layer 42 is fixed to a supporting substrate 26, configured of a silicon semiconductor substrate, on the basis of a solder joining method via a junction layer 25 formed of a solder layer including a gold (Au) layer or tin (Sn).

In the third embodiment, after sequentially forming the active layer 23, the second compound semiconductor layer 22, the second electrode 32, and second light reflecting layer 42 on the first compound semiconductor layer 21, the GaN substrate 11 is removed while using the first light reflecting layer 41 as a stopper layer. Specifically, the active layer 23, the second compound semiconductor layer 22, the second electrode 32, and the second light reflecting layer 42 are sequentially formed on the first compound semiconductor layer 21, and then, after fixing the second light reflecting layer 42 to the supporting substrate 26, the GaN substrate 11 is removed with use of the first light reflecting layer 41 as a stopper layer, whereby the first compound semiconductor layer 21 (first face of the first compound semiconductor layer 21) and the first light reflecting layer 41 are exposed. Then, the first electrode 31 is formed on the first compound semiconductor layer 21 (first face of the first compound semiconductor layer 21).

A distance from the first light reflecting layer 41 to the second light reflecting layer 42 is 0.15 μm or more but 50 μm or less, and specifically, it is 10 μm, for example. In the light-emitting element of the third embodiment, the first light reflecting layer 41 and the first electrode 31 separate from each other, that is, they have an offset, and the separated distance is 1 mm or less, and specifically, an average thereof is 0.05 mm.

Figure 7A:
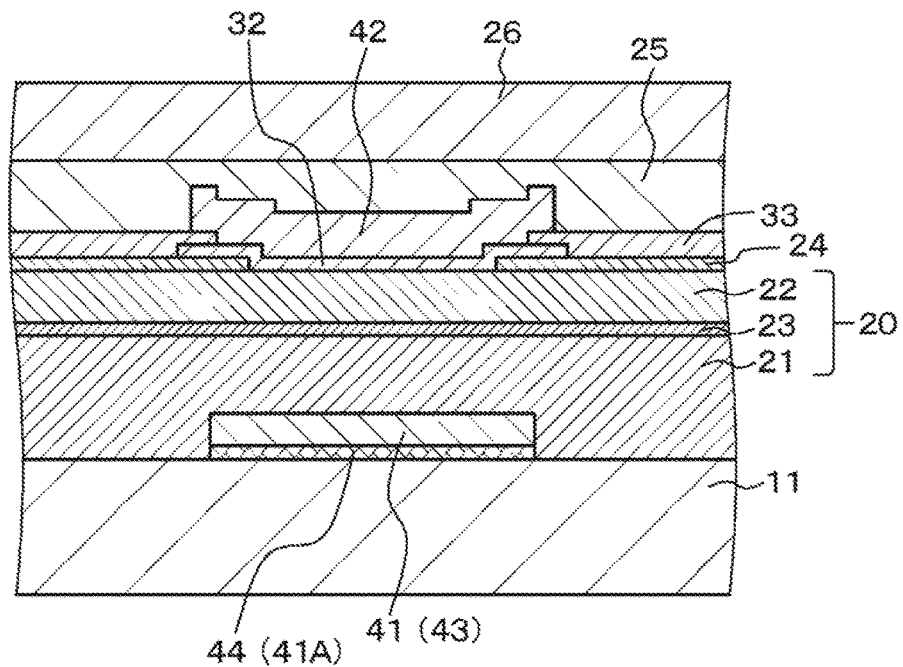
FIG. 7A and FIG. 7B are schematic partial end views of a layered structure and the like for explaining a light-emitting element manufacturing method of the third embodiment.
Figure 7B:
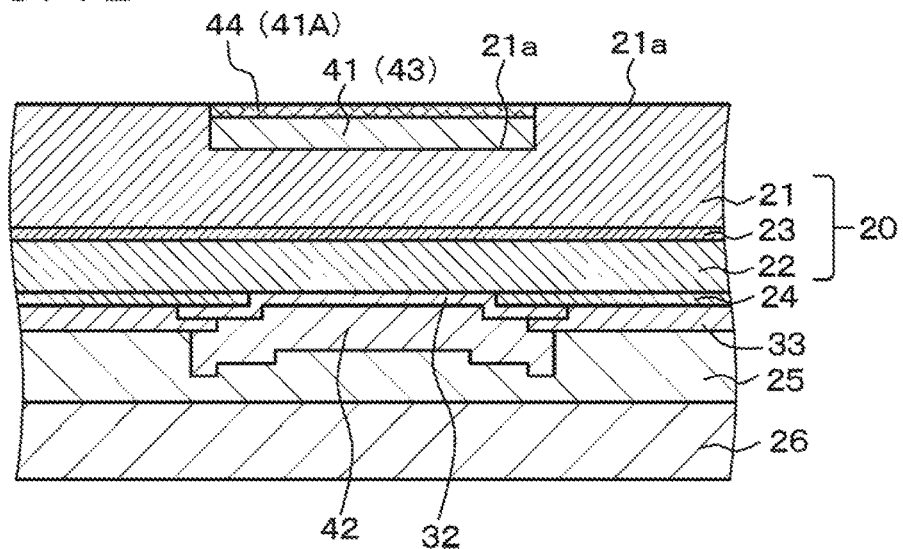

Hereinafter, a light-emitting element manufacturing method of the third embodiment will be described with reference to FIG. 7A and FIG. 7B each illustrating a schematic partial end view of a layered structure and the like.

[Step-300]
First, the structure shown in FIG. 1A is obtained by performing steps similar to [step-100] to [step-120] of the first embodiment, provided that the first electrode 31 is not formed.
[Step-310]
After that, the second light reflecting layer 42 is fixed to the supporting substrate 26 via the junction layer 25. In this way, the structure shown in FIG. 7A can be obtained.
[Step-320]
Then, the GaN substrate 11 is removed to expose the first face 21a of the first compound semiconductor layer 21 and the first light reflecting layer 41. Specifically, first, the thickness of the GaN substrate 11 is reduced on the basis of a mechanical polishing method, and then, on the basis of a CMP method, the remaining portion of the GaN substrate 11 is removed. In this way, the first face 21a of the first compound semiconductor layer 21 and the first light reflecting layer 41 are exposed, whereby the structure shown in FIG. 7B can be obtained.
[Step-330]
After that, the first electrode 31 is formed on the first face 21a of the first compound semiconductor layer 21 on the basis of a well-known method. In this way, the light-emitting element of the third embodiment having the structure shown in FIG. 6A can be obtained.
[Step-340]
After that, by performing so-called element isolation, the light-emitting element is separated, and the side faces of the layered structure and the exposed faces are covered with an insulating film made of $SiO_X$, for example. Then, terminals and the like are formed on the basis of a well-known method in order to connect the first electrode 31 and the pad electrode 33 with an external circuit or the like, and packaging and sealing are performed, whereby the light-emitting element of the third embodiment is completed.

In the light-emitting element manufacturing method of the third embodiment, the GaN substrate is removed in a state where the first light reflecting layer is formed. As such, as a result that the first light reflecting layer functions as a kind of stopper when the GaN substrate is removed, it is possible to suppress occurrence of variations in removal of the GaN substrate in the GaN substrate surface, and further, variations in the thickness of the first compound semiconductor layer, whereby the length of the resonator can be uniform. Consequently, it is possible to achieve stability of the characteristics of the light-emitting element obtained. In addition, as the surface of the first compound semiconductor layer (flat surface) on the interface between the first light reflecting layer and the first compound semiconductor layer is flat, it is possible to minimize light scattering on the flat surface.

Figure 6B:
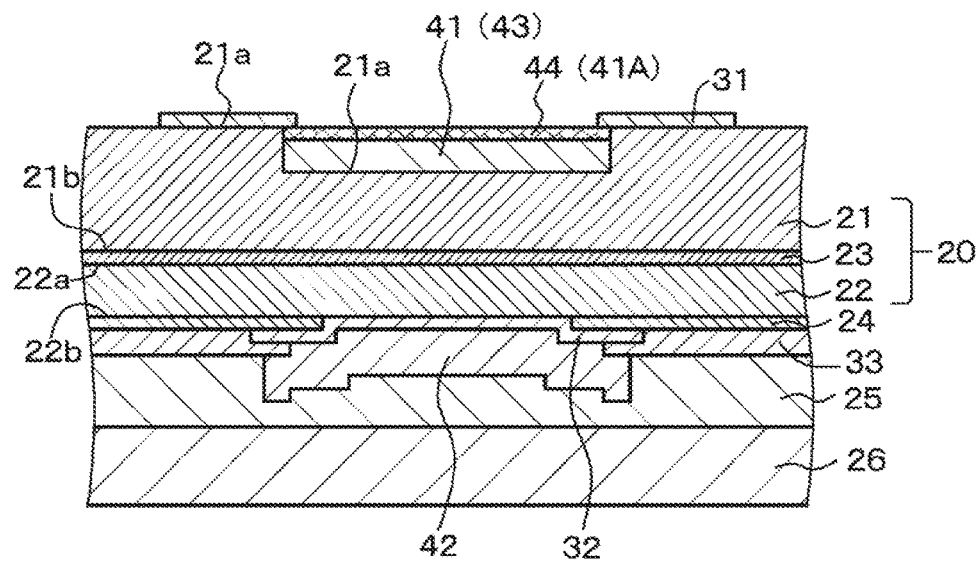

In the exemplary light-emitting element shown in FIG. 6A, an end of the first electrode 31 is separated from the first light reflecting layer 41. Meanwhile, in the exemplary light-emitting element shown in FIG. 6B, an end of the first electrode 31 extends to the outer periphery of the first light reflecting layer 41. Alternatively, the first electrode may be formed such that an end of the first electrode is brought into contact with the first light reflecting layer.

Figure 8A:
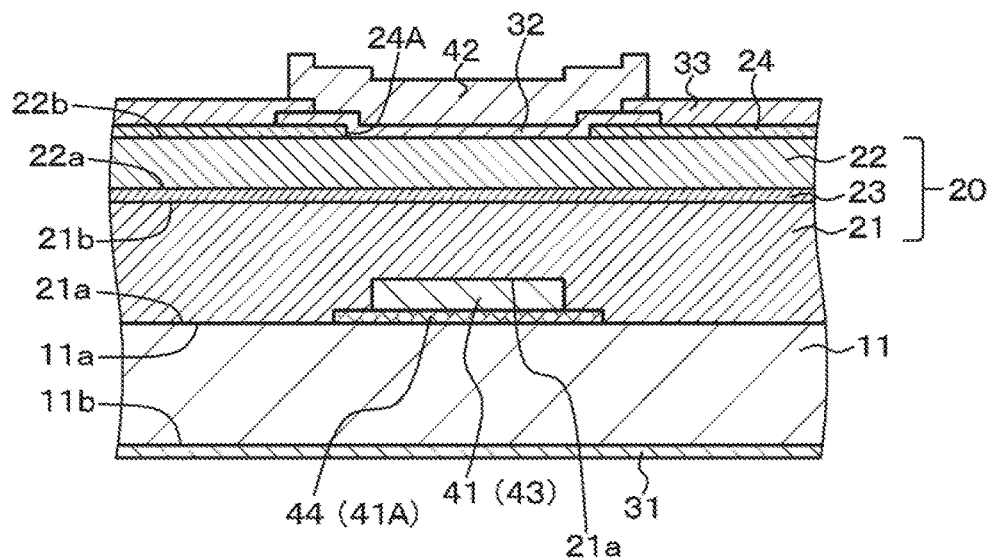
FIG. 8A and FIG. 8B are schematic partial sectional views of still other exemplary modifications of the light-emitting element of the first embodiment.
Figure 8B:
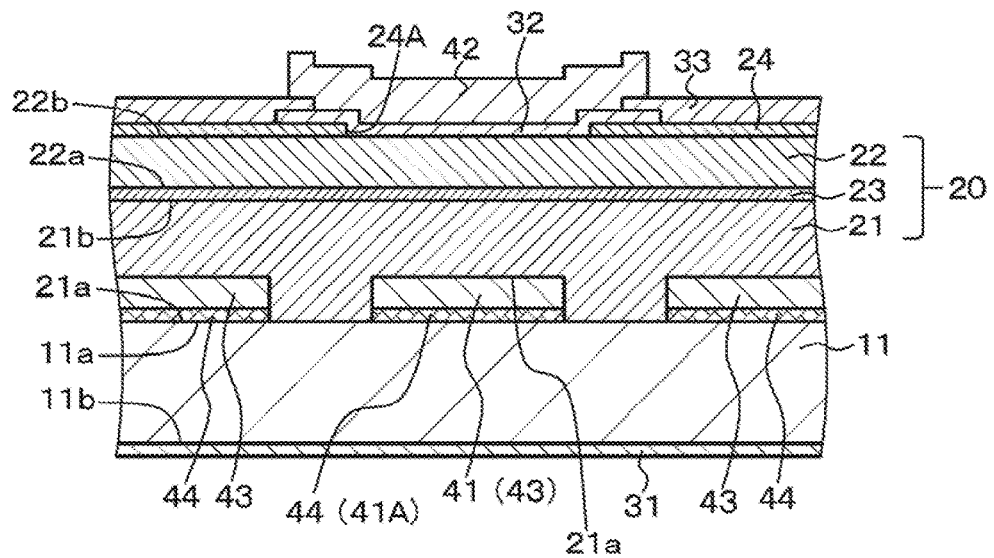

While the present disclosure has been described above on the basis of preferable embodiments, the present disclosure is not limited to these embodiments. The configurations and the structures of the light-emitting elements described in the embodiments are exemplarily shown, which can be changed appropriately, and the light-emitting element manufacturing methods of the embodiments can also be changed appropriately. As shown in FIG. 8A illustrating a schematic partial sectional view of an exemplary modification of the light-emitting element of the first embodiment, the bottom layer of the selective growth mask layer or the bottom layer of the first light reflecting layer may have a larger planar shape than that of a layer above the bottom layer. Further, in the embodiments, while description has been given on an example in which one light-emitting element is provided with one selective growth mask layer 43 (first light reflecting layer 41), the present disclosure is not limited to such a configuration. As shown in FIG. 8B illustrating a schematic partial sectional view of an exemplary modification of the light-emitting element of the first embodiment, a configuration in which one light-emitting element is provided with a plurality of selective growth mask layers 43 and one of them is allowed to function as the first light reflecting layer 41, is also acceptable.

It should be noted that the present disclosure is also able to take configurations as described below.

[A01] <<Light-emitting element manufacturing method: First aspect>>
A light-emitting element manufacturing method including at least the steps of:
after forming a selective growth mask layer on a GaN substrate;
selectively growing a first compound semiconductor layer from a surface of the GaN substrate not covered with the selective growth mask layer, and covering the GaN substrate and the selective growth mask layer with the first compound semiconductor layer; and then
sequentially forming an active layer, a second compound semiconductor layer, a second electrode, and a second light reflecting layer, on the first compound semiconductor layer, wherein
the selective growth mask layer functions as a first light reflecting layer,
an off angle of plane orientation of the surface of the GaN substrate is 0.4 degrees or less, preferably 0.40 degrees or less,
an area of the selective growth mask layer is $0.8S_0$ or less, where $S_0$ represents an area of the GaN substrate, and
as a bottom layer of the selective growth mask layer, a thermal expansion relaxation film is formed on the GaN substrate.

[A02] The light-emitting element manufacturing method according to [A01], wherein the thermal expansion relaxation film is made of at least one type of material selected from the group consisting of silicon nitride, aluminumoxide, niobium oxide, tantalum oxide, titanium oxide, magnesium oxide, zirconium oxide, and aluminum nitride.

[A03] The light-emitting element manufacturing method according to [A01] or [A02], wherein $$t_1 = \lambda_0/(2n_1)$$

is satisfied, where $t_1$ represents a thickness of the thermal expansion relaxation film, $\lambda_0$ represents an emission wavelength of the light-emitting element, and $n_1$ represents a refractive index of the thermal expansion relaxation film.

[A04] <<Light-emitting element manufacturing method: Second aspect>>
A light-emitting element manufacturing method including at least the steps of:
after forming a selective growth mask layer on a GaN substrate;
selectively growing a first compound semiconductor layer from a surface of the GaN substrate not covered with the selective growth mask layer, and covering the GaN substrate and the selective growth mask layer with the first compound semiconductor layer; and then sequentially forming an active layer, a second compound semiconductor layer, a second electrode, and a second light reflecting layer, on the first compound semiconductor layer, wherein the selective growth mask layer functions as a first light reflecting layer, an off angle of plane orientation of the surface of the GaN substrate is 0.4 degrees or less, preferably 0.40 degrees or less, an area of the selective growth mask layer is $0.8S_0$ or less, where $S_0$ represents an area of the GaN substrate, and a linear thermal expansion coefficient (CTE) of the bottom layer of the selective growth mask layer in contact with the GaN substrate satisfies $$1\times10^{-6}/K \leq CTE \leq 1\times10^{-3}/K,$$

preferably $$1\times10^{-6}/K < CTE \leq 1\times10^{-3}/K.$$

[A05] The light-emitting element manufacturing method according to [A04], wherein the bottom layer of the selective growth mask layer is made of at least one type of material selected from the group consisting of silicon nitride, aluminum oxide, niobium oxide, tantalum oxide, titanium oxide, magnesium oxide, zirconium oxide, and aluminum nitride.

[A06] The light-emitting element manufacturing method according to [A04] or [A05], wherein $$t_1 = \lambda_0/(2n_1)$$

is satisfied, where $t_1$ represents a thickness of the bottom layer of the selective growth mask layer, $\lambda_0$ represents an emission wavelength of the light-emitting element, and $n_1$ represents a refractive index of the bottom layer of the selective growth mask layer.

[A07] The light-emitting element manufacturing method according to any one of [A01] to [A06], further including after forming the active layer, the second compound semiconductor layer, the second electrode, and the second light reflecting layer sequentially on the first compound semiconductor layer, removing the GaN substrate while using the first light reflecting layer as a stopper layer.

[A08] The light-emitting element manufacturing method according to any one of [A01] to [A07], wherein surface roughness Ra of the second compound semiconductor layer is 1.0 nm or less.

[A09] The light-emitting element manufacturing method according to any one of [A01] to [A08], wherein a planar shape of the selective growth mask layer is a regular hexagonal shape, a circular shape, a lattice shape, or a stripe shape.

[B01] <<Light-emitting element: First aspect>>

A light-emitting element including at least:

a GaN substrate;

a first light reflecting layer formed on the GaN substrate and functioning as a selective growth mask layer;

a layered structure formed on the first light reflecting layer, the layered structure including a first compound semiconductor layer, an active layer, and a second compound semiconductor layer; and a second electrode and a second light reflecting layer formed on the second compound semiconductor layer, wherein an off angle of plane orientation of the surface of the GaN substrate is 0.4 degrees or less, preferably 0.40 degrees or less, an area of the first light reflecting layer is $0.8S_0$ or less, where $S_0$ represents an area of the GaN substrate, and as a bottom layer of the first light reflecting layer, a thermal expansion relaxation film is formed on the GaN substrate.

[B02] The light-emitting element manufacturing method according to [B01], wherein the thermal expansion relaxation film is made of at least one type of material selected from the group consisting of silicon nitride, aluminum oxide, niobium oxide, tantalum oxide, titanium oxide, magnesium oxide, zirconium oxide, and aluminum nitride.

[B03] The light-emitting element manufacturing method according to [B01] or [B02], wherein $$t_1 = \lambda_0/(2n_1)$$

is satisfied, where $t_1$ represents a thickness of the thermal expansion relaxation film, $\lambda_0$ represents an emission wavelength of the light-emitting element, and $n_1$ represents a refractive index of the thermal expansion relaxation film.

[B04] <<Light-emitting element: Second aspect>>

A light-emitting element including at least:

a GaN substrate;

a first light reflecting layer formed on the GaN substrate and functioning as a selective growth mask layer;

a layered structure formed on the first light reflecting layer, the layered structure including a first compound semiconductor layer, an active layer, and a second compound semiconductor layer; and a second electrode and a second light reflecting layer formed on the second compound semiconductor layer, wherein an off angle of plane orientation of the surface of the GaN substrate is 0.4 degrees or less, preferably 0.40 degrees or less, an area of the first light reflecting layer is $0.8S_0$ or less, where $S_0$ represents an area of the GaN substrate, and a linear thermal expansion coefficient (CTE) of the bottom layer of the first light reflecting layer in contact with the GaN substrate satisfies $$1\times10^{-6}/K \leq CTE \leq 1\times10^{-5}/K,$$

preferably $$1\times10^{-6}/K < CTE \leq 1\times10^{-5}/K.$$

[B05] The light-emitting element according to [B04], wherein the bottom layer of the first light reflecting layer is made of at least one type of material selected from the group consisting of silicon nitride, aluminum oxide, niobium oxide, tantalum oxide, titanium oxide, magnesium oxide, zirconium oxide and aluminum nitride.

[B06] The light-emitting element according to [B04] or [B05], wherein $$t_1 = \lambda_0/(2n_1)$$

is satisfied, where $t_1$ represents a thickness of the bottom layer of the first light reflecting layer, $\lambda_0$ represents an emission wavelength of the light-emitting element, and $n_1$ represents a refractive index of the bottom layer of the first light reflecting layer.

[B07] The light-emitting element manufacturing method according to any one of [B01] to [B06], wherein surface roughness Ra of the second compound semiconductor layer is 1.0 nm or less.

[B08] A method of manufacturing the light-emitting element according to anyone of [B01] to [B07], wherein a planar shape of the first light reflecting layer is a regular hexagonal shape, a circular shape, a lattice shape, or a stripe shape.

REFERENCE SIGNS LIST

11 GaN substrate
20 Layered structure
21 First compound semiconductor layer
21a First face of first compound semiconductor layer
21b Second face of first compound semiconductor layer
22 Second compound semiconductor layer
22a First face of second compound semiconductor layer
22b Second face of second compound semiconductor layer
23 Active layer (light emitting layer)
24 Current constriction layer
24A Opening formed in current constriction layer
25 Junction layer
26 Supporting substrate
31 First electrode
32 Second electrode
33 Pad electrode
41 First light reflecting layer
41A Bottom layer of first light reflecting layer
42 Second light reflecting layer
43 Selective growth mask layer
44 Thermal expansion relaxation film

The invention claimed is:

1. A method of manufacturing a light-emitting element, the method comprising:
    forming a selective growth mask layer on a GaN substrate, wherein the selective growth mask layer comprises a first light reflecting layer;
    selectively growing a first compound semiconductor layer from a surface of the GaN substrate not covered with the selective growth mask layer, and covering the GaN substrate and the selective growth mask layer with the first compound semiconductor layer;
    forming an active layer on the first compound semiconductor layer;
    forming a second compound semiconductor layer on the active layer;
    forming an electrode on the second compound semiconductor layer; and
    forming a second light reflecting layer on the electrode, wherein
        an off angle of plane orientation of the surface of the GaN substrate is 0.4 degrees or less,
        an area of the selective growth mask layer is $0.8S_0$ or less, where $S_0$ represents an area of the GaN substrate, and
        a thermal expansion relaxation film is on the GaN substrate as a bottom layer of the selective growth mask layer.

2. The method according to claim 1, wherein the thermal expansion relaxation film comprises at least one type of material selected from the group consisting of silicon nitride, aluminum oxide, niobium oxide, tantalum oxide, titanium oxide, magnesium oxide, zirconium oxide, and aluminum nitride.

3. The method according to claim 1, wherein $t_1 = \lambda_0/(2n_1)$ is satisfied, where $t_1$ represents a thickness of the thermal expansion relaxation film, $\lambda_0$ represents an emission wavelength of the light-emitting element, and $n_1$ represents a refractive index of the thermal expansion relaxation film.

4. The method according to claim 1, further comprising removing the GaN substrate while using the first light reflecting layer as a stopper layer, after forming the active layer, the second compound semiconductor layer, the electrode, and the second light reflecting layer sequentially on the first compound semiconductor layer.

5. The method according to claim 1, wherein surface roughness Ra of the second compound semiconductor layer is 1.0 nm or less.

6. The method according to claim 1, wherein a planar shape of the selective growth mask layer is one of a regular hexagonal shape, a circular shape, a lattice shape, or a stripe shape.

7. A method of manufacturing a light-emitting element, the method comprising:
    forming a selective growth mask layer on a GaN substrate, wherein the selective growth mask layer comprises a first light reflecting layer;
    selectively growing a first compound semiconductor layer from a surface of the GaN substrate not covered with the selective growth mask layer, and covering the GaN substrate and the selective growth mask layer with the first compound semiconductor layer; and
    sequentially forming an active layer, a second compound semiconductor layer, an electrode, and a second light reflecting layer on the first compound semiconductor layer, wherein
        an off angle of plane orientation of the surface of the GaN substrate is 0.4 degrees or less,
        an area of the selective growth mask layer is $0.8S_0$ or less, where $S_0$ represents an area of the GaN substrate, and
        a linear thermal expansion coefficient (CTE) of a bottom layer of the selective growth mask layer in contact with the GaN substrate satisfies:

$1 \times 10^{-6}/K \leq CTE \leq 1 \times 10^{-5}/K$.

8. The method according to claim 7, wherein the bottom layer of the selective growth mask layer comprises at least one type of material selected from the group consisting of silicon nitride, aluminum oxide, niobium oxide, tantalum oxide, titanium oxide, magnesium oxide, zirconium oxide, and aluminum nitride.

9. The method according to claim 7, wherein $t_1 = \lambda_0/(2n_1)$ is satisfied, where $t_1$ represents a thickness of the bottom layer of the selective growth mask layer, $\lambda_0$ represents an emission wavelength of the light-emitting element, and $n_1$ represents a refractive index of the bottom layer of the selective growth mask layer.

10. A light-emitting element, comprising:
    a GaN substrate;
    a selective growth mask layer on the GaN substrate, wherein the selective growth mask layer comprises a first light reflecting layer;
    a first compound semiconductor layer on the selective growth mask layer and the GaN substrate;
    an active layer on the first compound semiconductor layer;

a second compound semiconductor layer on the active layer;

an electrode on the second compound semiconductor layer; and a second light reflecting layer on the electrode, wherein an off angle of plane orientation of a surface of the GaN substrate is 0.4 degrees or less, an area of the selective growth mask layer is $0.8S_0$ or less, where $S_0$ represents an area of the GaN substrate, and a thermal expansion relaxation film is on the GaN substrate as a bottom layer of the selective growth mask layer.

11. A light-emitting element, comprising:

a GaN substrate;

a selective growth mask layer on the GaN substrate, wherein the selective growth mask layer comprises a first light reflecting layer;

a layered structure on the selective growth mask layer, the layered structure including a first compound semiconductor layer, an active layer, and a second compound semiconductor layer; and an electrode and a second light reflecting layer on the second compound semiconductor layer, wherein an off angle of plane orientation of a surface of the GaN substrate is 0.4 degrees or less, an area of the selective growth mask layer is $0.8S_0$ or less, where $S_0$ represents an area of the GaN substrate, and a linear thermal expansion coefficient (CTE) of a bottom layer of selective growth mask layer in contact with the GaN substrate satisfies:

$1\times10^{-6}/K \leq CTE \leq 1\times10^{-5}/K$.

12. A method of manufacturing a light-emitting element, the method comprising:

forming a selective growth mask layer on a GaN substrate, wherein the selective growth mask layer comprises a first light reflecting layer;

selectively growing a first compound semiconductor layer from a surface of the GaN substrate not covered with the selective growth mask layer, and covering the GaN substrate and the selective growth mask layer with the first compound semiconductor layer;

sequentially forming an active layer, a second compound semiconductor layer, an electrode, and a second light reflecting layer on the first compound semiconductor layer; and removing the GaN substrate while using the first light reflecting layer as a stopper layer, after forming the active layer, the second compound semiconductor layer, the electrode, and the second light reflecting layer sequentially on the first compound semiconductor layer, wherein an off angle of plane orientation of the surface of the GaN substrate is 0.4 degrees or less, an area of the selective growth mask layer is $0.8S_0$ or less, where $S_0$ represents an area of the GaN substrate, and a thermal expansion relaxation film is on the GaN substrate as a bottom layer of the selective growth mask layer.

* * * * *